(12) United States Patent
Ozawa

(10) Patent No.: US 12,352,896 B2
(45) Date of Patent: Jul. 8, 2025

(54) LIGHT DETECTION APPARATUS AND CONTROL METHOD OF LIGHT DETECTION APPARATUS, AND RANGING APPARATUS

(71) Applicant: Sony Semiconductor Solutions Corporation, Kanagawa (JP)

(72) Inventor: Osamu Ozawa, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 1046 days.

(21) Appl. No.: 17/297,199

(22) PCT Filed: Nov. 20, 2019

(86) PCT No.: PCT/JP2019/045367
§ 371 (c)(1),
(2) Date: May 26, 2021

(87) PCT Pub. No.: WO2020/116158
PCT Pub. Date: Jun. 11, 2020

(65) Prior Publication Data
US 2022/0026536 A1    Jan. 27, 2022

(30) Foreign Application Priority Data
Dec. 5, 2018 (JP) ................. 2018-227809

(51) Int. Cl.
*G01S 7/481* (2006.01)
*G01S 17/08* (2006.01)
*H10F 30/225* (2025.01)
(52) U.S. Cl.
CPC ............ *G01S 7/4816* (2013.01); *G01S 17/08* (2013.01); *H10F 30/225* (2025.01)

(58) Field of Classification Search
CPC ............... G01S 7/4816; G01S 17/08; G01S 2013/9323; G01S 7/4861; G01S 13/931;
(Continued)

(56) References Cited

U.S. PATENT DOCUMENTS 4,438,348 A * 3/1984 Casper ............... H04B 10/6911
250/238
4,479,052 A 10/1984 Suzuki
(Continued)

FOREIGN PATENT DOCUMENTS

CN    107271036 A    10/2017
CN    107063453 B    8/2018
(Continued)

OTHER PUBLICATIONS

U.S. Appl. No. 62/630,079 (Year: 2018).*
(Continued)

*Primary Examiner* — Luke D Ratcliffe
*Assistant Examiner* — Jempson Noel
(74) *Attorney, Agent, or Firm* — Michael Best & Friedrich LLP

(57) ABSTRACT

A light detection apparatus according to the present disclosure includes a light-receiving element, a load circuit connected to the light-receiving element, and a control portion configured to control a recharge current that flows through the load circuit in accordance with an element characteristic of the light-receiving element. In addition, a ranging apparatus according to the present disclosure includes: a light source configured to radiate light toward a measurement object; and a light detection apparatus configured to detect light reflected by the measurement object, when the light detection apparatus configured as described above is used as the light detection apparatus.

18 Claims, 14 Drawing Sheets

(58) Field of Classification Search
CPC ............ H01L 31/107; H01L 31/02027; H04N 25/773; G01J 1/44; G01J 2001/444; G01J 2001/4466; G01C 3/06
See application file for complete search history.

(56) References Cited

U.S. PATENT DOCUMENTS

| | | | | |
|---|---|---|---|---|
| 5,852,491 | A * | 12/1998 | Kato | ............ G01S 17/10 342/135 |
| 7,705,284 | B2 * | 4/2010 | Inoue | ............ G01J 1/44 398/189 |
| 2008/0217521 | A1 * | 9/2008 | Forsyth | ............ G01J 1/44 250/214 R |
| 2014/0061443 | A1 | 3/2014 | Jiang | |
| 2014/0191115 | A1 | 7/2014 | Webster | |
| 2016/0054447 | A1 * | 2/2016 | Sun | ............ G01S 17/10 356/5.01 |
| 2016/0373126 | A1 * | 12/2016 | Kim | ............ H01L 31/024 |
| 2017/0090019 | A1 * | 3/2017 | Slobodyanyuk | ......... G01S 17/10 |
| 2017/0127491 | A1 * | 5/2017 | Pope | ............ H05B 45/12 |
| 2017/0192112 | A1 | 7/2017 | Sandvik | |
| 2018/0019825 | A1 * | 1/2018 | Shirai | ............ H04J 14/0256 |
| 2018/0180471 | A1 | 6/2018 | Marra et al. | |
| 2019/0250257 | A1 * | 8/2019 | Finkelstein | ............ G01S 7/487 |
| 2020/0018832 | A1 | 1/2020 | Azuma | |

FOREIGN PATENT DOCUMENTS

| | | |
|---|---|---|
| JP | 02-500789 A | 3/1990 |
| JP | 07-63854 A | 3/1995 |
| JP | 2000077705 A | 3/2000 |
| JP | 2015-117970 A | 6/2015 |
| JP | 6215202 B | 10/2017 |
| WO | WO-2018181979 A1 | 10/2018 |

OTHER PUBLICATIONS

International Search Report (PCT/ISA/210), International Application No. PCT/JP2019/045367, dated Jan. 23, 2020.
Notification of Transmittal of the International Search Report and the Written Opinion of the International Searching Authority, or the Declaration (PCT/ISA/220), International Application No. PCT/JP2019/045367, dated Feb. 4, 2020.
Written Opinion of the International Search Authority (PCT/ISA/237), International Application No. PCT/JP2019/045367, dated Feb. 4, 2020.

* cited by examiner

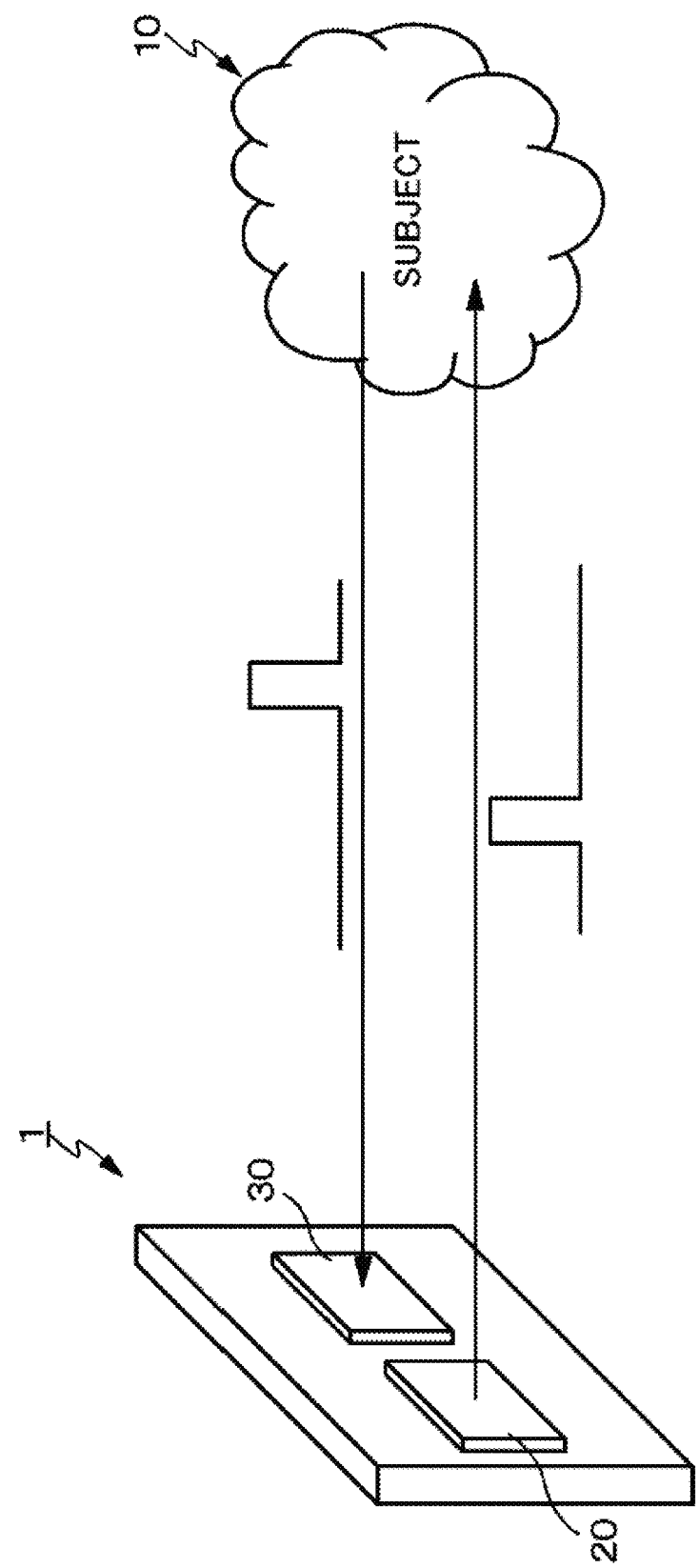

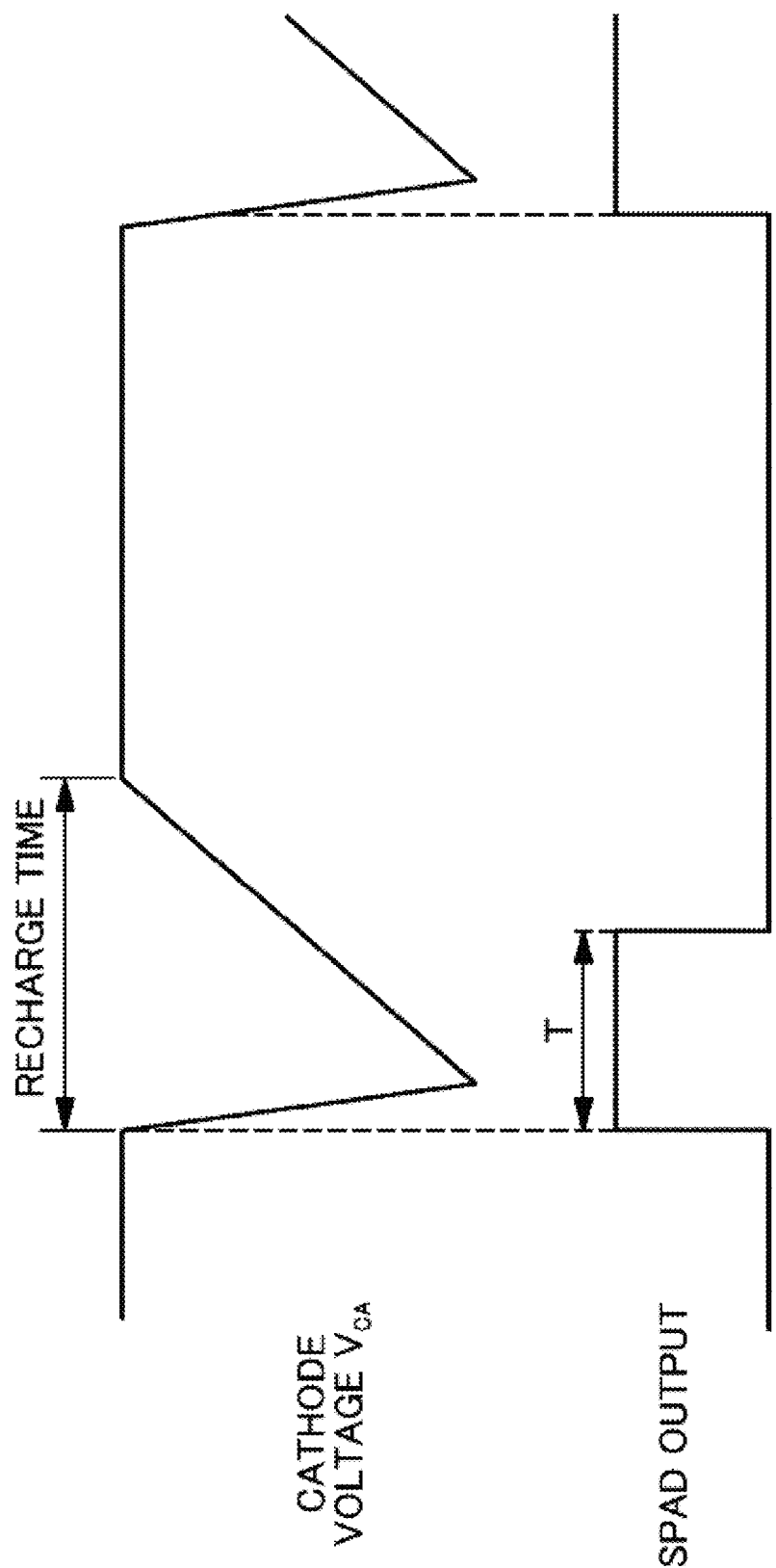

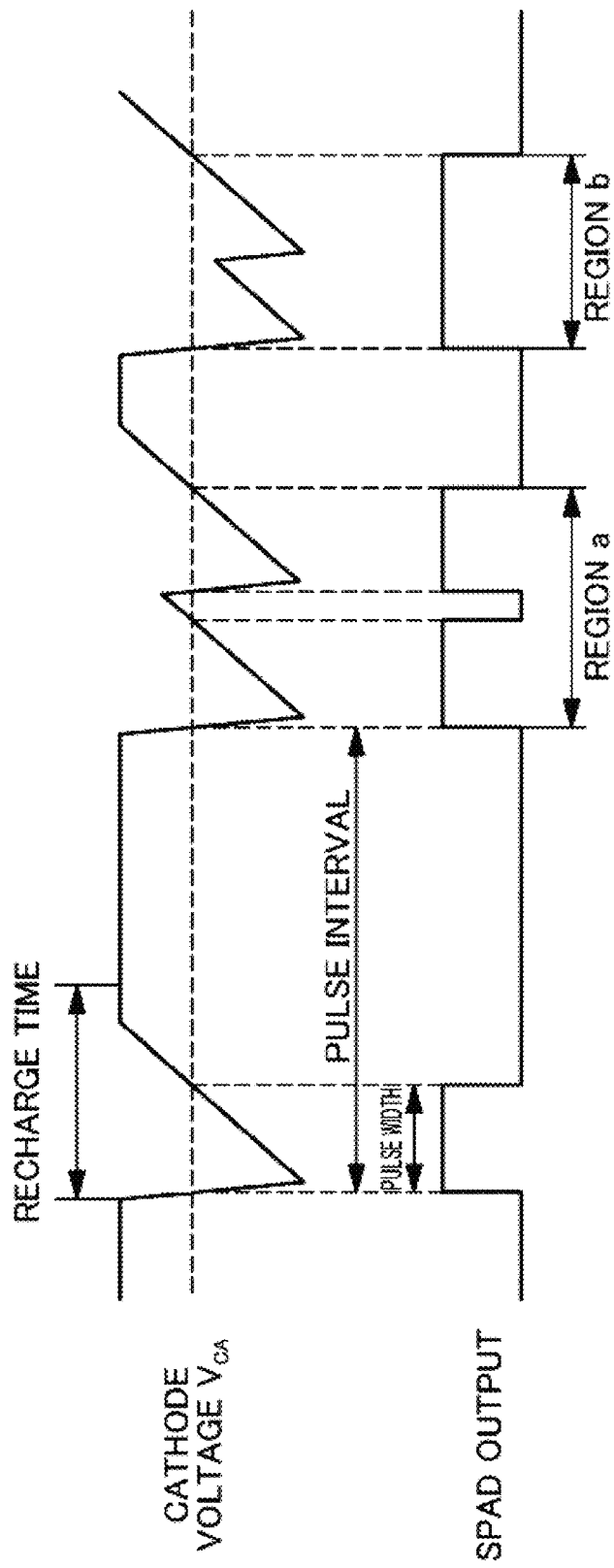

| BREAKDOWN VOLTAGE $V_{BD}$ | -20 | -19.5 | -18 | -18.5 | -18 | -17.5 | -17 |
|---|---|---|---|---|---|---|---|
| RECHARGE CURRENT $I_r$ | 9.5 | 9.8 | 10 | 10.2 | 10.4 | 10.5 | 10.6 |

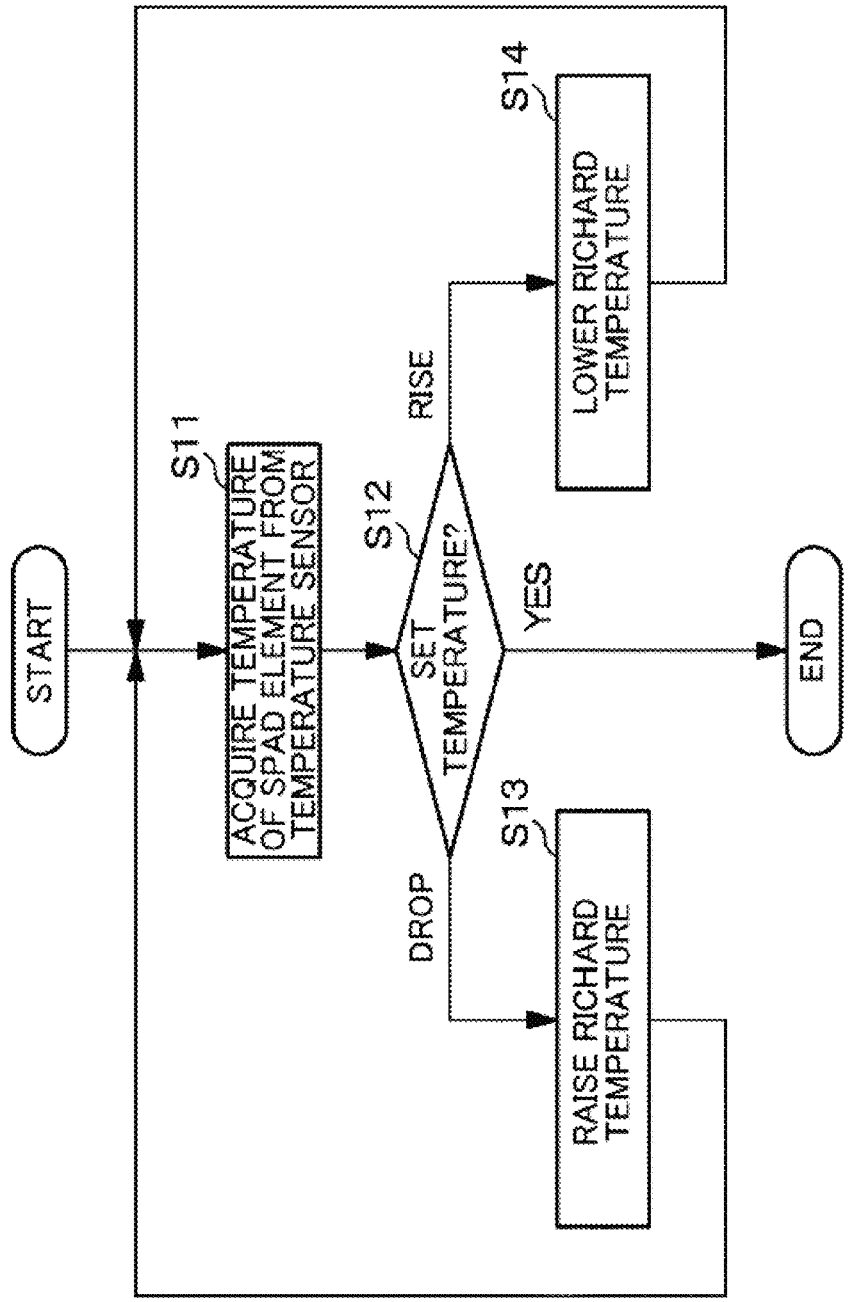

LIGHT DETECTION APPARATUS AND CONTROL METHOD OF LIGHT DETECTION APPARATUS, AND RANGING APPARATUS

TECHNICAL FIELD

The present disclosure relates to a light detection apparatus and a control method of a light detection apparatus, and to a ranging apparatus.

BACKGROUND ART

As a light-receiving element (a light-receiving portion) that performs light detection, there are ranging apparatuses using an element that generates a signal in response to receiving a photon (for example, refer to PTL 1). With the ranging apparatus according to conventional art, based on a measurement result of a ToF (Time of Flight), the number of pulses is measured when light intensity is low but a width of the pulses is measured when light intensity is high.

CITATION LIST

Patent Literature

[PTL 1]
JP 2014-081254 A

SUMMARY

Technical Problem

When using a light-receiving element that generates a signal in response to receiving a photon for light detection, for example, when a SPAD (Single Photon Avalanche Diode) element is used, a recharge operation of passing a recharge current through the light-receiving element must be performed in order to recover a cathode voltage having been lowered by an avalanche current. However, when the recharge current is too large, a state where the cathode voltage does not drop sufficiently and a through-current continues to flow is created or, in other words, a so-called latching current problem occurs during light detection.

While the recharge current must be determined in consideration of the avalanche current in order to prevent the latching current problem from occurring, since the avalanche current is highly temperature-dependent, the avalanche current is to be set in consideration of worst considerations. However, when an operating temperature request range of the light-receiving element is wide, a problem occurs under conditions such as room temperature in that time during which the light-receiving element cannot react as a light sensor or, in other words, a so-called dead time becomes unnecessarily extended.

The conventional art according to PTL 1 described above does not take the temperature dependence of an avalanche current into consideration.

An object of the present disclosure is to provide a light detection apparatus capable of performing a light detection operation without causing a latching current; problem over a wide temperature range and a control method of the light; detection apparatus, and a ranging apparatus including the light detection apparatus.

Solution to Problem

A light detection apparatus according to the present disclosure for achieving the object described above includes:

a light-receiving element;
a load circuit connected to the light-receiving element; and
a control portion configured to control a recharge current that flows through the load circuit in accordance with an element characteristic of the light-receiving element.

In addition, a control method of a light detection apparatus according to the present disclosure for achieving the object described above includes, when controlling a light detection apparatus including:
a light-receiving element; and
a load circuit connected to the light-receiving element,
controlling a recharge current that flows through the load circuit in accordance with an element characteristic of the light-receiving element. Furthermore, a ranging apparatus (a distance measurement apparatus) according to the present disclosure for achieving the object described above includes: a light source configured to radiate light toward a measurement object; and
a light detection apparatus configured to detect light reflected by the measurement object, wherein
the light detection apparatus configured as described above is used as the light detection apparatus.

BRIEF DESCRIPTION OF DRAWINGS

FIG. 1 is a schematic configuration diagram showing a ranging apparatus according to an embodiment of the present disclosure.

FIG. 5 is a waveform diagram for explaining a circuit operation of a pixel circuit.

FIG. 6 is a waveform diagram for explaining a dead time DT of a SPAD element when a light radiation dose is relatively small.

FIG. 12 is a flow chart showing an example of processing of a control method of a light detection apparatus according to a fifth embodiment.

DESCRIPTION OF EMBODIMENTS

Figure 2A:
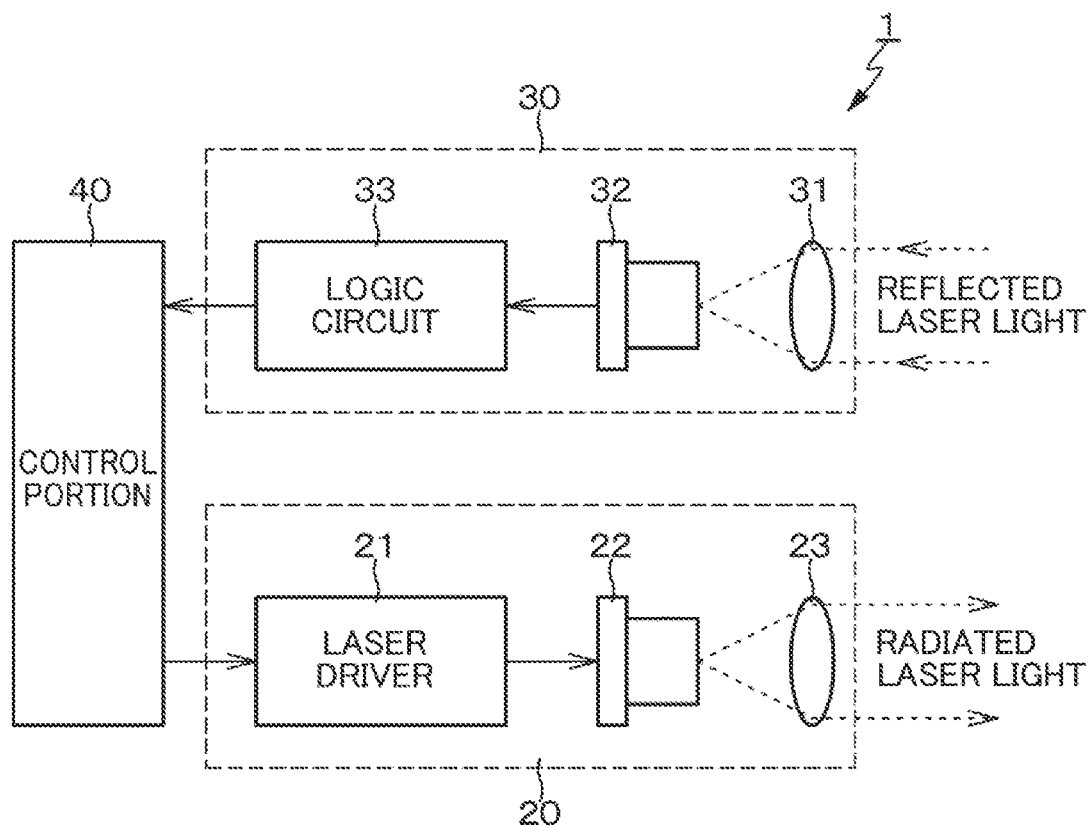
FIGS. 2A and 2B are block diagrams showing a specific configuration of the ranging apparatus according to the embodiment of the present disclosure.

Hereinafter, a mode (hereinafter, referred to as an embodiment) for implementing the technique according to the present disclosure will be described in detail with reference to the drawings. It is to be understood that the technique according to the present disclosure is not limited to the embodiment and various numerical values and the like in the embodiment are exemplary. In the following description, a same reference sign will be used for a same element or elements having a same function and redundant descriptions will be omitted. The description will be given in the following order, 1. General description of light detection apparatus and ranging apparatus according to present disclosure
2. Ranging apparatus according to embodiment
2-1. Outline of configuration of ranging apparatus
2-2. Basic pixel circuit of light detection apparatus using SPAD element
2-2-1. Pixel circuit according to first example
2-2-2. Pixel circuit according to second example
2-3. Circuit operations of pixel circuit
2-4. Dead time DT of SPAD element
2-5. Latching current problem
3. Light detection apparatus according to embodiment
3-1. First example (example where element characteristic of SPAD element is temperature)
3-2. Second example (modification of first example: example where load circuit is constituted by constant-current source)
3-3. Third example (example where element characteristic of SPAD element is avalanche current)
3-4. Fourth example (example where element characteristic of SPAD element is breakdown voltage)
3-5. Fifth example (example of control method of light detection apparatus according to embodiment)
4. Modifications
5. Example of application of technique according to present disclosure (example of mobile body)
6. Configurations adoptable by present disclosure General Description of Light Detection Apparatus and Ranging Apparatus According to Present Disclosure With the light detection apparatus and the ranging apparatus according to the present disclosure, a mode can be adopted in which an element characteristic of a light-receiving element; is a temperature of the light-receiving element as detected by a temperature sensor. In this case, a control portion can be configured to perform control involving raising a recharge current in accordance with a drop in the temperature of the light-receiving element.

With the light detection apparatus and the ranging apparatus according to the present disclosure including the preferable mode and configuration described above, a mode can be adopted in which the element characteristic of the light-receiving element is an avalanche current of the light-receiving element. In this case, the control portion can be configured to perform control of the recharge current so that a ratio between the avalanche current of the light-receiving element and the recharge current becomes constant.

Alternatively, with the light detection apparatus and the ranging apparatus according to the present disclosure including the preferable modes and configurations described above, a mode can be adopted in which the element characteristic of the light-receiving element is a breakdown voltage of the light-receiving element. In this case, the control portion can be configured to perform control involving raising the recharge current in accordance with a drop in the breakdown voltage of the light-receiving element. In addition, the control portion can be configured to perform control of the recharge current based on a lookup table that associates the breakdown voltage of the light-receiving element and the recharge current with each other.

Furthermore, with the light detection apparatus and the ranging apparatus according to the present disclosure including the preferable modes and configurations described above, a configuration can be adopted in which the light-receiving element is an element configured to generate a signal in accordance with the reception of a photon. Moreover, a configuration can be adopted in which the light-receiving element is constituted by a single photon avalanche diode.

Ranging Apparatus According to Embodiment

Outline of Configuration of Ranging Apparatus

FIG. 1 is a schematic configuration diagram showing a ranging apparatus according to an embodiment of the present disclosure. A ranging apparatus 1 according to the present embodiment adopts, as a measurement method for measuring a distance to a subject 10 that is a measurement object, a ToF method of measuring time until light (for example, laser light) having been radiated toward the subject 10 returns after being reflected by the subject 10. In order to realize distance measurement by the ToF method, the ranging apparatus 1 according to the present embodiment includes a light source 20 and a light detection apparatus 30. In addition, a light detection apparatus according to the embodiment of the present disclosure to be described later is used as the light detection apparatus 30.

Figure 2B:
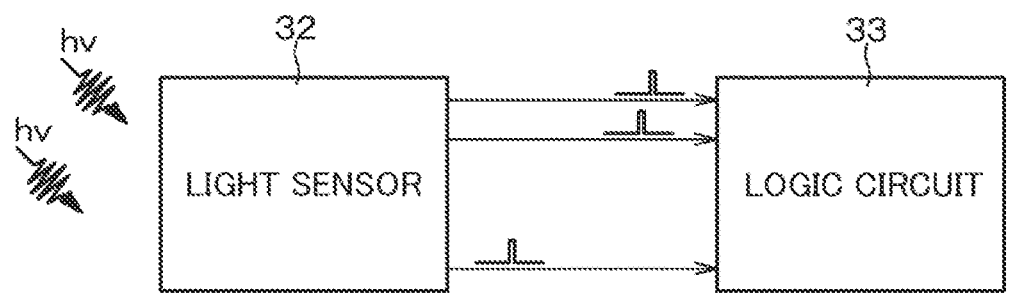

FIGS. 2A and 2B show a specific configuration of the ranging apparatus 1 according to the present embodiment. For example, the light source 20 has a laser driver 21, a laser light source 22, and a diffusing lens 23 and radiates laser light toward the subject 10. The laser driver 21 drives the laser light source 22 under control of a control portion 40. The laser light source 22 is made of, for example, a semiconductor laser and emits laser light by being driven by the laser driver 21. The diffusing lens 23 diffuses laser light emitted from the laser light source 22 and radiates the diffused laser light toward the subject 10.

The light detection apparatus 30 has a light-receiving lens 31, a light sensor 32, and a logic circuit 33 and receives reflected laser light that is radiated laser light emitted from a laser radiating portion 20 and is reflected on the subject 10 and returns back. The light-receiving lens 31 collects reflected laser light from the subject 10 on a light-receiving surface of the light sensor 32. The light sensor 32 receives the reflected laser light from the subject 10 via the light-receiving lens 31 in units of a pixel and photoelectrically converts the reflected laser light. An output signal of the light sensor 32 is supplied to the control portion 40 via the logic circuit 33. Details of the light sensor 32 will be described later.

For example, the control portion 40 is constituted by a CPU (Central Processing Unit) or the like, controls the light source 20 and the light detection apparatus 30, and measures time period t from the time point of radiation of laser light that is emitted from the light source 20 toward the subject 10 to the time point of returning after being reflected on the subject 10. A distance L to the subject 10 can be obtained based on the measured time period t.

As a method of measuring time period t, time period t is measured by starting a timer at a timing where pulse light is radiated from the light source 20 and stopping the timer at a timing where the pulse light is received by the light detection apparatus 30. As another method of time measurement, pulse light may be radiated from the light source 20 at a predetermined period, a period upon the light detection apparatus 30 receiving the pulse light may be detected, and time period t may be measured based on a phase difference between the period of light emission and the period of light reception. Time measurement is executed a plurality of times and time period t is measured by detecting a peak of a histogram created by stacking up a plurality of measured times.

As the light sensor 32, a two-dimensional array sensor (a so-called area sensor) constituted by pixels including a light-receiving element; (a light-receiving portion) and being arranged in a two-dimensional array or a one-dimensional array sensor (a so-called line sensor) constituted by pixels including a light-receiving element and being arranged linearly can also be used.

In addition, in the present embodiment, a sensor in which the light-receiving element of a pixel is constituted by an element that generates a signal in response to receiving a photon such as sensor made up of a SPAD (Single Photon Avalanche Diode) element is used as the light sensor 32. In other words, the light detection apparatus 30 according to the present embodiment is configured such that the light-receiving element of a pixel is constituted by a SPAD element. It should be noted that the light-receiving element is not limited to a SPAD element; and other various elements such as an APD (Avalanche Photo Diode) or a CAPD (Current Assisted Photonic Demodulator) may be used.

Basic Pixel Circuit of Light Detection Apparatus Using SPAD Element

Figure 3A:
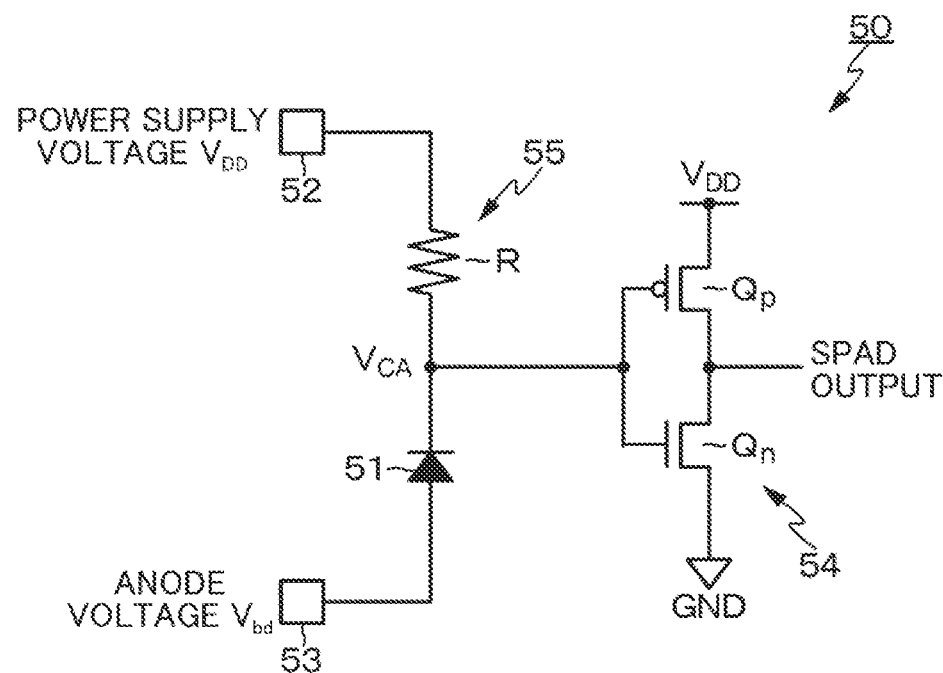
FIG. 3A is a circuit diagram showing a first example of a basic pixel circuit of a light detection apparatus using a SPAD element.
Figure 3B:
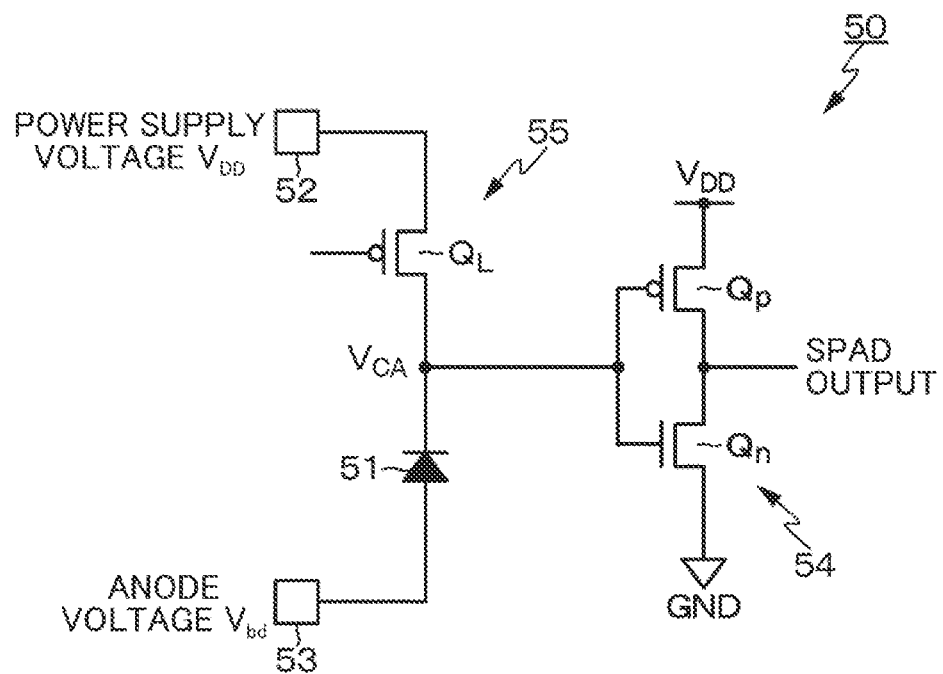
FIG. 3B is a circuit diagram showing a second example of a basic pixel circuit of the light detection apparatus using a SPAD element.

FIG. 3A shows a first example and FIG. 3B shows a second example of a basic pixel circuit of the light detection apparatus 80 using a SPAD element. In this case, a basic configuration corresponding to one pixel is illustrated.

Pixel Circuit According to First Example

The first example of the pixel circuit is an example in which a load circuit 55 is constituted by a resistive element R. In a SPAD element 51 of a pixel circuit 50 according to the first example, a cathode electrode is connected via the resistive element R that is the load circuit 55 to a terminal 52 to which a power supply voltage $V_{DD}$ is applied and an anode electrode is connected to a terminal 53 to which an anode voltage $V_{bd}$ is applied. As the anode voltage $V_{bd}$, a negative voltage large enough to cause an avalanche multiplication is applied. In addition, a cathode voltage $V_{CA}$ of the SPAD element 51 is derived as a SPAD output (a pixel output) via a waveform shaping circuit 54 constituted by a P-type MOS transistor Q and an N-type MOS transistor $Q_n$.

Figure 4A:
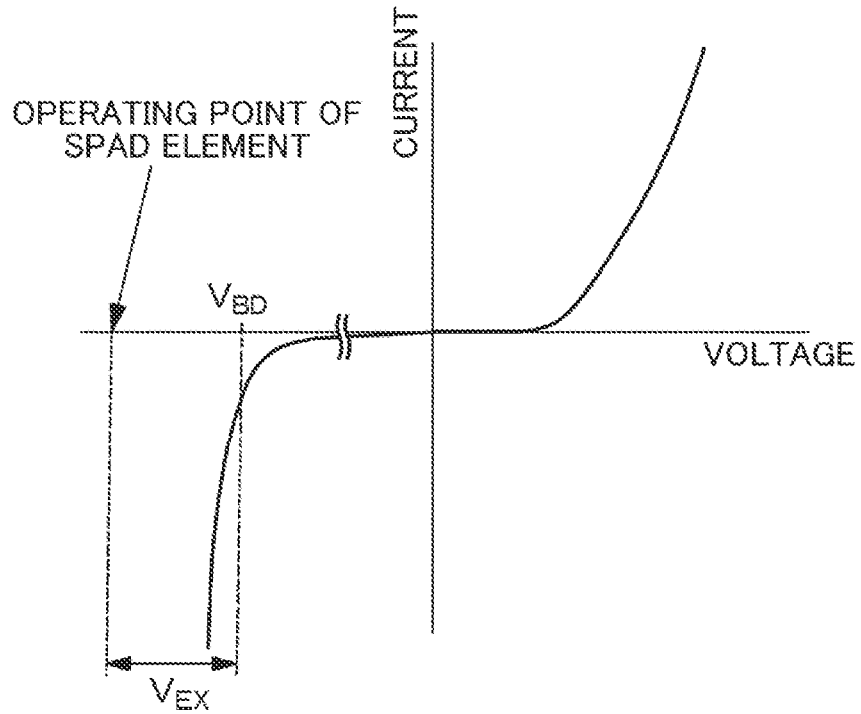
FIG. 4A is a characteristic diagram showing current-voltage characteristics of a PN junction of a SPAD element.

A voltage equal to or higher than a breakdown voltage $V_{BD}$ (for example, −50 to −10 V) is applied to the SPAD element 51. An excess voltage equal to or higher than the breakdown voltage Van is referred to as an excess bias voltage $V_{EX}$ and is generally a voltage of around 2 to 5 V. This is a larger value than a conventional photodiode. The SPAD element 51 operates in a region called a Geiger mode that; is devoid of a DC stabilization point. FIG. 4A shows I (current)-V (voltage) characteristics of a PN junction of the SPAD element 51.

Figure 4B:
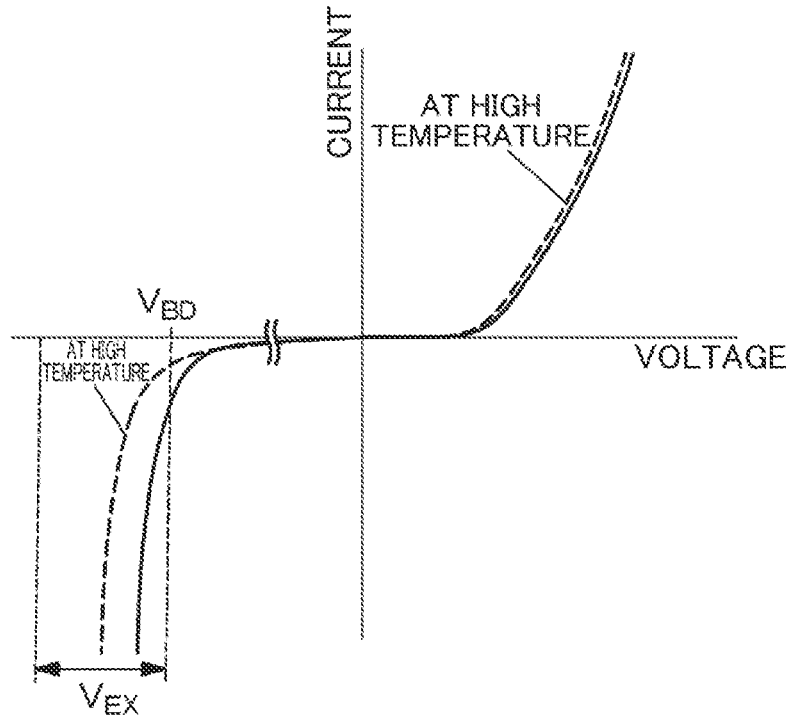
FIG. 4B is a characteristic diagram for explaining behavior at high temperature of the current-voltage characteristics of the PN junction.

A behavior of I-V characteristics of the PN junction of the SPAD element 51 at high temperature will be described using a characteristic diagram shown in FIG. 4B. In the characteristic diagram in FIG. 4B, characteristics at high temperature are depicted by a dashed line. At high temperature, the breakdown voltage $V_{BD}$ shifts toward a negative side and an avalanche current $I_a$ decreases. In other words, at high temperature, since a lattice vibration of silicon is large, a mean free path of electrons is shorter. Therefore, even when a high electrical field is applied, since only a small number of electrons reach high energy, the avalanche current $I_a$ is less likely to occur.

Pixel Circuit According to Second Example

The second example of the pixel circuit is an example in which the load circuit 55 is constituted by a constant-current source such as a P-type MOS transistor $Q_L$. The pixel circuit 50 according to the second example only differs from the pixel circuit 50 according to the first example shown in FIG. 3A in that the load circuit 55 in the pixel circuit 50 according to the first example has been changed from the resistive element R to the P-type MOS transistor $Q_L$ and other circuit components are basically the same.

Circuit Operations of Pixel Circuit

Next, circuit operations of the pixel circuit 50 configured as described above will be described using a waveform diagram shown in FIG. 5.

In a state where a current does not flow through the SPAD element 51, a voltage of $V_{DD}-V_{bd}$ is applied to the SPAD element 51. The voltage value $(V_{DD}-V_{bd})$ equates to $(V_{BD}+V_{EX})$. In addition, electrons generated due to a dark electron generation rate DCR (Dark Count Rate) and light irradiation at the PN junction of the SPAD element 51 causes an avalanche multiplication to occur and an avalanche current $I_a$ is generated. This phenomenon probabilistically occurs even in a state where light is shielded (in other words, a state where there is no incident light). This is called a dark electron generation rate DCR.

When the cathode voltage $V_{CA}$ drops and an inter-terminal voltage of the SPAD element 51 or, in other words, the cathode voltage $V_{CA}$ becomes equal to the breakdown voltage $V_{BD}$ of the PN diode, the avalanche current $I_a$ is suspended. This operation is a so-called quench operation and the cathode voltage $V_{CA}$ of the SPAD element 51 at this point is a quench voltage.

Subsequently by supplying a recharge current from the resistive element R or the P-type MOS transistor $Q_L$ that constitutes the load circuit 55, the cathode voltage $V_{CA}$ of the SPAD element 51 recovers from the quench voltage to the power supply voltage $V_{DD}$ and returns to its initial state. In other words, the load circuit 55 constituted by the resistive element R or the P-type MOS transistor $Q_L$ is a recharge circuit which supplies the SPAD element 51 with the recharge current $I_r$ in order to restore the cathode voltage $V_{CA}$ of the SPAD element 51.

Even when one electron-hole pair is generated by incidence of light to the SPAD element 51, since the electron-hole pair acts as a seed and the avalanche current $I_a$ is generated, the incidence of even one photon can be detected at a certain probabilistic PDE (Photon Detection Efficiency). The probabilistic PDE at which a photon can be detected is usually around several % to 20%.

The operations described above are repetitively performed. In addition, in the series of operations, a waveform of the cathode voltage $V_{CA}$ is shaped by the waveform shaping circuit 54 and a pulse signal with a pulse width T of which an arrival time of one photon is a start point becomes an SPAD output (a pixel output).

The SPAD element 51 is a high-performance light sensor capable of detecting the incidence of a single photon at a certain probabilistic PDE. However, once a photon is detected, there is a period of several nano seconds to several ten nano seconds during which the SPAD element 51 cannot react to a photon as a light sensor or, in other words, a dead time DT. Therefore, when a detection frequency of photons rises under a high light intensity condition and a total period of the dead time becomes non-negligible with respect to observation time, light detection accuracy declines.

Dead Time DT During Which Photons Cannot be Reacted To

The dead time DT during which a light sensor cannot react to photons will now be described in greater detail using a waveform diagram shown in FIG. 6. As described above, in the SPAD element 51, there exists a dead time DT attributable to time required by the cathode voltage $V_{CA}$ to recover to the power supply voltage $V_{DD}$ in which incidence of light cannot be reacted to. For example, while avalanche multiplication occurs twice and, accordingly, two pulse signals are generated as SPAD output in a region a, only one pulse signal is generated despite avalanche multiplication occurring twice in a region b.

Theoretically, the SPAD element 51 does not generate a SPAD output with respect to incidence of light that occurs after a reaction by the SPAD element 51 and until the cathode voltage $V_{CA}$ reaches or exceeds a threshold voltage of the waveform shaping circuit 54 of a subsequent stage. In other words, this period constitutes the dead time DT and a pulse width T represents a limit value thereof.

Latching Current Problem

As described above, a light detection operation using the SPAD element 51 is performed by repeating generation/suspension of the avalanche current $I_a$. The cathode voltage $V_{CA}$ of the SPAD element 51 having been lowered by the avalanche current $I_a$ recovers to the power supply voltage $V_{DD}$ by being supplied the recharge current $I_r$ from the load circuit 55 (a constant-current source constituted by the resistive element R or the P-type MOS transistor $Q_L$).

In this case, since the larger the recharge current $I_r$ the quicker the recovery of the cathode voltage $V_{CA}$ to the power supply voltage $V_{DD}$ and the shorter the dead time DT during which a light sensor cannot react to photons, a larger recharge current $I_r$ is advantageous in terms of characteristics. In other words, the larger the recharge current $I_r$, the shorter a recovery time (the dead time DT) and the more favorable the characteristics that can be realized as a light sensor. However, the recharge current $I_r$ must be made sufficiently smaller than the avalanche current $I_a$ and temperature dependence is high.

As will be described later, the ranging apparatus 1 having the light detection apparatus 30 which uses the SPAD element 51 as the light sensor 32 can be used mounted to a mobile body such as an automobile. When attempting to realize operations in a wide temperature range such as when mounting the ranging apparatus 1 to a vehicle, adverse effects such as deterioration of the dead time DT at room temperature occur.

The SPAD element 51 has a diode structure, and in a state where a current does not flow through the SPAD element 51, a larger voltage than the breakdown voltage $V_{BD}$ is being applied (Geiger mode). When the avalanche current $I_a$ attributable to a photon or thermal noise flows in this state and causes the cathode voltage $V_{CA}$ of the SPAD element 51 to drop and a difference voltage ($V_{CA}$-$V_{AN}$) with the anode voltage $V_{AN}$ equals the breakdown voltage $V_{BD}$, the avalanche current $I_a$ is suspended and an ON/OFF operation is performed. However, since the breakdown voltage $V^{BD}$ has a high temperature dependence, a larger voltage must be applied under a high temperature condition and the avalanche current $I_a$ also decreases.

When the SPAD element 51 is used for light detection, in order to cause the cathode voltage $V_{CA}$ having been lowered by the avalanche current $I_a$ to recover, a recharge operation is performed by a constant-current source constituted by the resistive element R or the P-type MOS transistor $Q_L$ as described earlier. In addition, the larger the recharge current the quicker the recovery and the shorter the dead time DT during which a light sensor cannot react.

On the other hand, during light detection, the avalanche current $I_a$ of the SPAD element 51 must be set sufficiently larger than the recharge current $I_r$ and the cathode voltage $V_{CA}$ must be lowered until the cathode voltage $V_{CA}$ becomes equal to the breakdown voltage $V_{BD}$. Therefore, when the recharge current $I_r$ is too large, a latching current problem occurs in which the cathode voltage $V_{CA}$ does not drop sufficiently and a through-current continues to flow during light detection.

Therefore, while the recharge current $I_r$ must be determined in consideration of the avalanche current $I_a$ in order to prevent the latching current problem from occurring, since the avalanche current $I_a$ is highly temperature-dependent, the recharge current $I_r$ is to be set in consideration of worst considerations. When an operating temperature request range is wide such as when the ranging apparatus 1 is mounted to a vehicle or the like, a problem occurs under conditions such as room temperature in that the dead time DT becomes unnecessarily extended.

Light Detection Apparatus According to Embodiment

The light detection apparatus 30 according to the embodiment of the present disclosure is configured such that a control portion which controls the recharge current $I_r$ flowing through the load circuit 55 controls the recharge current $I_r$ in accordance with an element characteristic of the SPAD element 51 that is an example of the light-receiving element. Accordingly, since the light detection apparatus 30 can perform a light detection operation in a wide temperature range such as when mounting the light detection apparatus 30 to a vehicle without causing a latching current problem, for example, a specified vehicle-mount temperature can be accommodated. In addition, since an appropriate recharge current $I_r$ can be set for each temperature, the recharge current $I_r$ need not be determined under a worst condition and an optimal dead time DT can be realized under each condition. Furthermore, a mode that intentionally extends the dead time DT such as an energy saving mode or a night-time mode can also be set.

Hereinafter, specific examples of the present embodiment in which the recharge current $I_r$ is controlled according to the element characteristic of the SPAD element 51 will be described.

First Example

Figure 7:
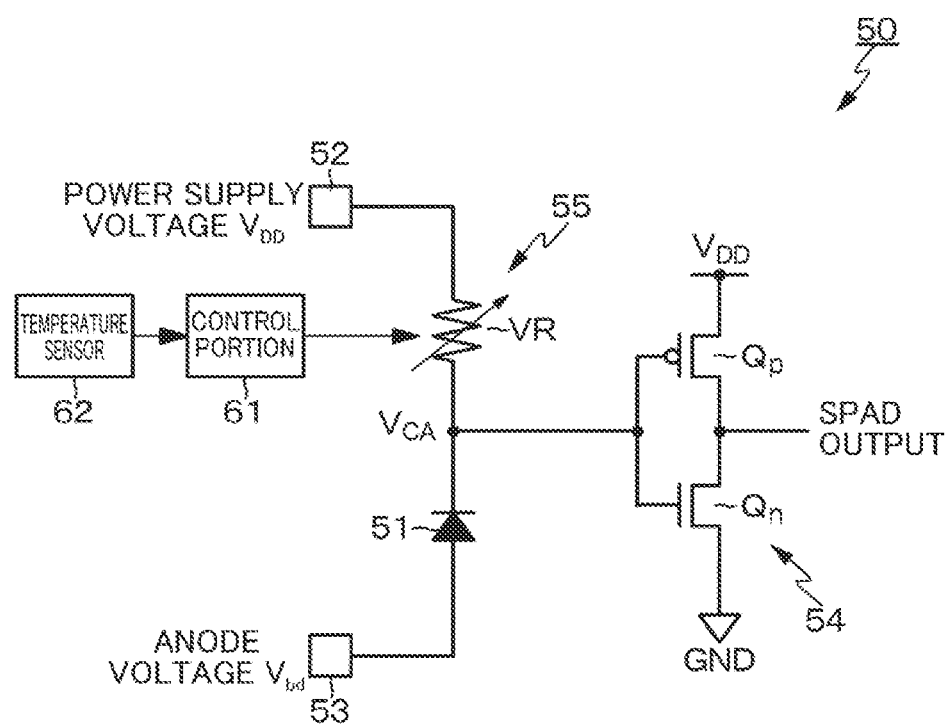
FIG. 7 is a circuit diagram showing a pixel circuit in a light detection apparatus according to a first embodiment.

A first example is an example where the element characteristic of the SPAD element 51 is temperature of the SPAD element 51. FIG. 7 shows a circuit diagram of a pixel circuit in a light detection apparatus according to the first example.

FIG. 7 illustrates a circuit configuration corresponding to one pixel. The pixel circuit 50 according to the first example includes, in addition to the SPAD element 51, the waveform shaping circuit 54, and the load circuit 55, a control portion 61 that controls the recharge current $I_r$ flowing through the load circuit 55 and a temperature sensor 62 that detects a temperature of the SPAD element 51 as the element characteristic of the SPAD element 51. The control portion 61 and the temperature sensor 62 are to be commonly provided with respect to a plurality of pixel circuits 50.

In addition, the pixel circuit 50 according to the first example uses a variable resistive element VR of which a resistance value is variable as the load circuit 55. The variable resistive element VR is capable of varying the recharge current $I_r$ to be supplied to the SPAD element 51 in accordance with a change in the resistance value.

While the variable resistive element VR is used as the load circuit 55 in this case, the load circuit 55 is not limited thereto and, for example, the load circuit 55 may be made of a combination of a plurality of resistive elements and a switch element and configured to change a resistance value using the switch element.

The control portion 61 adopts the temperature of the SPAD element 51 that is detected by the temperature sensor 62 as the element characteristic and controls the recharge current that flows through the load circuit 55 or, in other words, the recharge current $I_r$ which the SPAD element 51 is to be supplied in accordance with the element; characteristic. More specifically, the control portion 61 performs control involving raising the recharge current $I_r$ in accordance with a drop of the temperature of the SPAD element 51 with respect to a predetermined set temperature and lowering the recharge current $I_r$ in accordance with a rise of the temperature. At a low temperature, the dead time DT can be shortened by increasing the recharge current $I_r$. In addition, at a high temperature, a quench operation can be reliably realized by reducing the recharge current $I_r$.

For example, the light detection apparatus has a laminated structure made by laminating at least two semiconductor substrates, namely a first semiconductor substrate and a second semiconductor substrate, the SPAD element 51 is arranged in a two-dimensional array on the first semiconductor substrate, and circuit portions other than the SPAD element 51 such as the pixel circuit 50 are arranged on the second semiconductor substrate. In the laminated structure of the light detection apparatus, for example, the temperature sensor 62 can detect a temperature of the SPAD element 51 by being mounted on the second semiconductor substrate. As the temperature sensor 62, for example, a known temperature sensor can be used which measures a temperature by utilizing characteristics that electric properties change in proportion to a temperature change in a bandgap of a semiconductor.

As described above, in a light detection apparatus including the pixel circuit 50 according to the first example, the recharge current $I_r$ that flows through the load circuit 55 is controlled in accordance with a temperature of the SPAD element 51. Accordingly a light detection operation can be performed in a wide temperature range without causing a latching current problem. In addition, since an appropriate recharge current $I_r$ can be set for each temperature, the recharge current $I_r$ need not be determined under a worst condition and an optimal dead time DT can be realized under each condition.

Second Example

Figure 8:
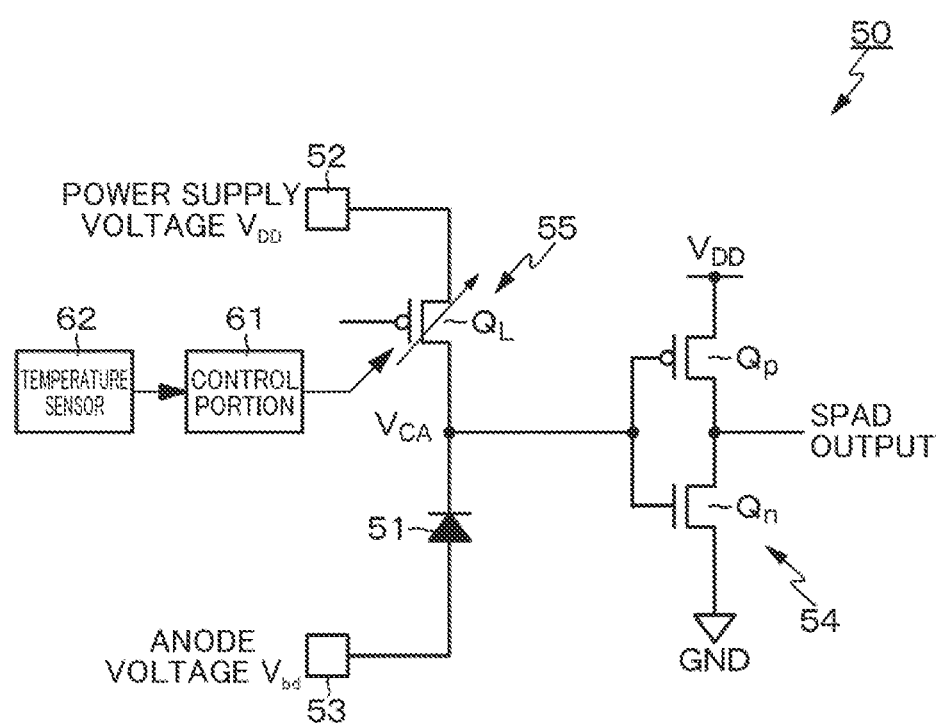
FIG. 8 is a circuit diagram showing a pixel circuit in a light detection apparatus according to a second embodiment.

A second example is a modification of the first example and represents an example in which the load circuit 55 is constituted by, for example, a P-type MOS transistor $Q_L$. FIG. 8 shows a circuit diagram of a pixel circuit in a light detection apparatus according to the second example.

The load circuit 55 is capable of varying the recharge current $I_r$ to be supplied to the SPAD element 51 in accordance with a change in a gate voltage of the P-type MOS transistor $Q_L$. Therefore, the control portion 61 controls the recharge current $I_r$ that flows through the load circuit 55 or, in other words, the recharge current $I_r$ which the SPAD element 51 is to be supplied in accordance with a temperature of the SPAD element 51 that is detected by the temperature sensor 62.

While a single P-type MOS transistor $Q_L$ is used as the load circuit 55 and the recharge current $I_r$ is controlled by changing the gate voltage of the P-type MOS transistor $Q_L$, the load circuit 55 is not limited thereto and can be configured to change the number of transistors which are connected in parallel and which constitute the P-type MOS transistor $Q_L$.

Even in the light detection apparatus including the pixel circuit 50 according to the second example in which the load circuit 55 is made of a constant-current source, a similar operational advantage to the light detection apparatus including the pixel circuit 50 according to the first example in which the load circuit 55 is made of a variable resistive element VR can be obtained. In other words, since the recharge current $I_r$ that flows through the load circuit 55 is controlled in accordance with a temperature of the SPAD element 51, a light detection operation can be performed in a wide temperature range without causing a latching current problem. In addition, since an appropriate recharge current $I_r$ can be set for each temperature, the recharge current $I_r$ need riot be determined under a worst condition and an optimal dead time DT can be realized under each condition.

Third Example

Figure 9:
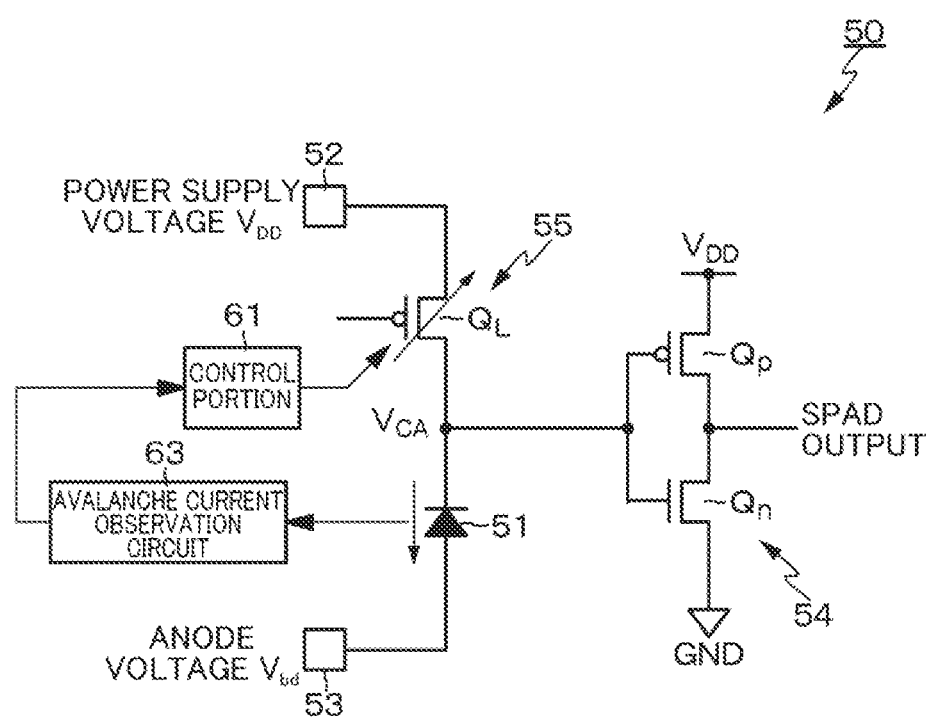
FIG. 9 is a circuit diagram showing a pixel circuit in a light detection apparatus according to a third embodiment.

A third example is an example where the element characteristic of the SPAD element 51 is the avalanche current $I_a$ of the SPAD element 51. FIG. 9 shows a circuit diagram of a pixel circuit in a light detection apparatus according to a fifth example.

In the pixel circuit 50 according to the third example, the load circuit 55 is made of a constant-current source such as a P-type MOS transistor $Q_L$ in a similar manner to the second example and a configuration is adopted in which the pixel circuit 50 has an avalanche current observation circuit 63 which monitors the avalanche current; $I_a$ of the SPAD element 51 as the element; characteristic of the SPAD element 51.

The control portion 61 adopts the avalanche current $I_a$ of the SPAD element 51 detected by the avalanche current observation circuit 63 as the element characteristic and controls the recharge current $I_r$ that flows through the load circuit 55 in accordance with the element characteristic. More specifically the control portion 61 controls the recharge current $I_r$ so that a ratio between the avalanche current $I_a$ of the SPAD element 51 and the recharge current $I_r$ becomes constant. The ratio between the avalanche current and the recharge current $I_r$ is fixed to, for example, a ratio of 100:1.

As described above, in a light detection apparatus including the pixel circuit 50 according to the third example, the recharge current $I_r$ that flows through the load circuit 55 is controlled in accordance with the avalanche current $I_a$ of the SPAD element 51. Accordingly, a light detection operation can be performed in a wide temperature range without causing a latching current problem. In addition, since an appropriate recharge current $I_r$ can be set for each temperature, the recharge current $I_r$ need not be determined under a worst condition and an optimal dead time DT can be realized under each condition.

While a pixel circuit in which the load circuit 55 is constituted by a constant-current source such as a P-type MOS transistor $Q_L$ in a similar manner to the second example has been exemplified in the third example, a similar operational advantage can be obtained even in a case of a pixel circuit in which the load circuit 55 is constituted by the variable resistive element VR in a similar manner to the first example.

Fourth Example

Figure 10:
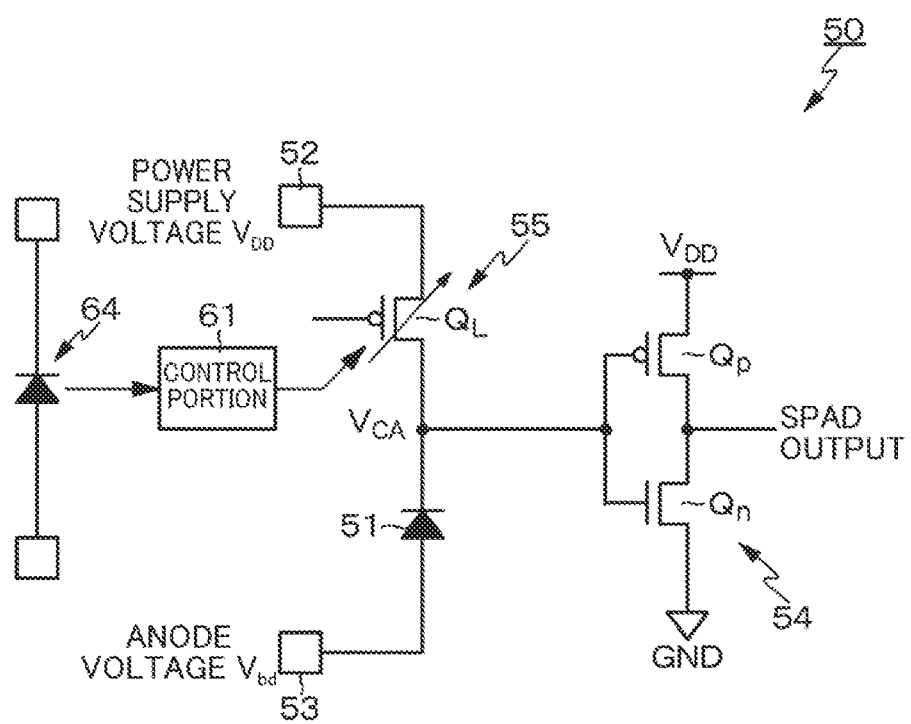
FIG. 10 is a circuit diagram showing a pixel circuit in a light detection apparatus according to a fourth embodiment.

A fourth example is an example where the element characteristic of the SPAD element 51 is a breakdown voltage $V_{BD}$ of the SPAD element 51. FIG. 10 shows a circuit diagram of a pixel circuit in a light detection apparatus according to the fourth example.

In the pixel circuit 50 according to the fourth example, the load circuit 55 is made of a constant-current source such as a P-type MOS transistor $Q_L$ in a similar manner to the second example and a configuration is adopted in which the pixel circuit 50 has a reference SPAD element 64 having a same element characteristic as the SPAD element 51 and a breakdown voltage $V_{BD}$ of the reference SPAD element 64 is monitored as the element characteristic of the SPAD element 51.

The breakdown voltage $V_{BD}$ of the reference SPAD element 64 can be obtained from I-V characteristics of the reference SPAD element 64. Specifically for example, a reverse voltage is applied to a cathode electrode/an anode electrode of a single reference SPAD element 64 and a voltage difference which causes a desired current to flow is defined as the breakdown voltage $V_{BD}$. Alternatively, a current is passed through the reference SPAD element 64 and a voltage difference that is generated at this point is monitored and defined as the breakdown voltage $V_{BD}$.

The control portion 61 adopts the breakdown voltage $V_{BD}$ of the reference SPAD element 64 as the element characteristic (the breakdown voltage $V_{BD}$) of the SPAD element 51 and controls the recharge current $I_r$ that flows through the load circuit 55 in accordance with the element characteristic. More specifically, the control portion 61 performs control involving raising the recharge current $I_r$ in accordance with a drop in the breakdown voltage Vim that is the element characteristic of the SPAD element 51.

In the SPAD element 51, the higher the temperature condition, the larger an absolute value of the breakdown voltage $V_{BD}$, and the avalanche current $I_a$ decreases even if an excess bias voltage VEX is constant. Therefore, an optimum current value is to be obtained in advance with respect to the recharge current $I_r$ that flows through the load circuit 55 under respective conditions of the breakdown voltage $V_{BD}$. In addition, a lookup table that associates the breakdown voltage $V_{BD}$ and the recharge current $I_r$ with each other is created and the recharge current $I_r$ is to be controlled based on the lookup table.

Figures 11A, 11B:
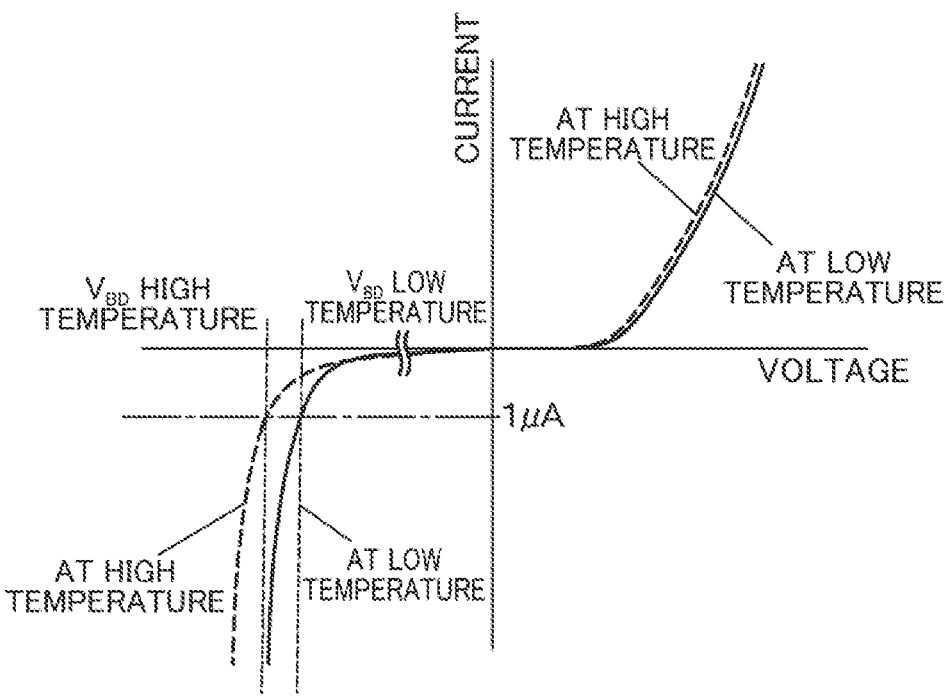
FIG. 11A is a characteristic diagram for explaining behavior at low temperature and high temperature of I-V characteristics of a PN junction of a SPAD element.
FIG. 11B is a diagram showing an example of a lookup table that associates a breakdown voltage and a recharge current with each other.

FIG. 11A shows behavior at low temperature and high temperature of I-VF characteristics of a PN junction of the SPAD element, and FIG. 11B shows an example of a lookup table that associates the breakdown voltage $V_{BD}$ and the recharge current $I_r$ with each other.

As described above, in a light detection apparatus including the pixel circuit 50 according to the fourth example, the recharge current $I_r$ that flows through the load circuit 55 is controlled in accordance with the breakdown voltage $V_{BD}$ of the SPAD element 51. Accordingly, a light detection operation can be performed in a wide temperature range without causing a latching current problem. In addition, since an appropriate recharge current $I_r$ can be set for each temperature, the recharge current $I_r$ need not be determined under a worst condition and an optimal dead time DT can be realized under each condition.

While a pixel circuit in which the load circuit 55 is constituted by a constant-current source such as a P-type MOS transistor $Q_L$ in a similar manner to the second example has been exemplified in the fourth example, a similar operational advantage can be obtained even in a case of a pixel circuit in which the load circuit 55 is made of the variable resistive element VR in a similar manner to the first example.

Fifth Example

A fifth example represents an example of a control method of the light detection apparatus 30 according to the embodiment of the present disclosure. FIG. 12 shows a flow chart of an example of processing of a control method of a light detection apparatus according to the fifth example.

In this case, as an example of a control method, a control method in the light detection apparatus according to the first example or, in other words, a light detection apparatus that uses a temperature of the SPAD element 51 as the element characteristic of the SPAD element 51 will be described. Processing of the present control method is executed under control by the control portion 61.

The control portion 61 acquires a temperature of the SPAD element 51 from the temperature sensor 62 as the element characteristic of the SPAD element 51 (step S11), compares the temperature of the SPAD element 51 having been acquired as the element characteristic of the SPAD element 51 with a predetermined set temperature (step S12), and when the temperature of the SPAD element 51 is the set temperature (YES in S12), the control portion 61 ends the series of processing for the present control method.

When the temperature of the SPAD element 51 is lower than the set temperature (drop in S12), the control portion 61 performs a processing step of raising the recharge current $I_r$ (step S13), subsequently returns to the processing of step S11, and repetitively executes the processing steps described above. In addition, when the temperature of the SPAD element 51 is higher than the set temperature (rise in S12), the control portion 61 performs a processing step of lowering the recharge current $I_r$ (step S14), subsequently returns to the processing of step S11, and repetitively executes the processing steps described above.

As described above, in the control method of a light detection apparatus according to the fifth example, a temperature of the SPAD element; 51 is acquired from the temperature sensor 62 as the element characteristic of the SPAD element 51 and the recharge current $I_r$ that flows through the load circuit 55 is controlled in accordance with the acquired temperature of the SPAD element 51. Accordingly a light detection operation can be performed in a wide temperature range without causing a latching current problem. In addition, since an appropriate recharge current $I_r$ can be set for each temperature, the recharge current $I_r$ need not be determined under a worst condition and an optimal dead time DT can be realized under each condition.

Modifications

While the technique according to the present disclosure has been heretofore described based on a preferable embodiment, the technique according to the present disclosure is not limited to the embodiment. Configurations and structures of an imaging apparatus described in the embodiment presented above are exemplary and various modifications can be made thereto as deemed appropriate. For example, while the embodiment presented above has been described using examples in which a SPAD element is used as a light-receiving element, the light-receiving element is not limited to a SPAD element and similar operational advantages can be obtained using an element; such as an APD or a CAPD.

Example of Application of Technique According to Present Disclosure

The technique according to the present disclosure can be applied to various products. Hereinafter, a more specific application example will be described. For example, the technique according to the present disclosure may be realized as a ranging apparatus to be mounted to any of various types of mobile bodies including an automobile, an electric vehicle, a hybrid electric vehicle, a motorcycle, a bicycle, personal mobility an airplane, a drone, an ocean vessel, a robot, construction machinery and agricultural and farm machinery (a tractor).

Mobile Body

Figure 13:
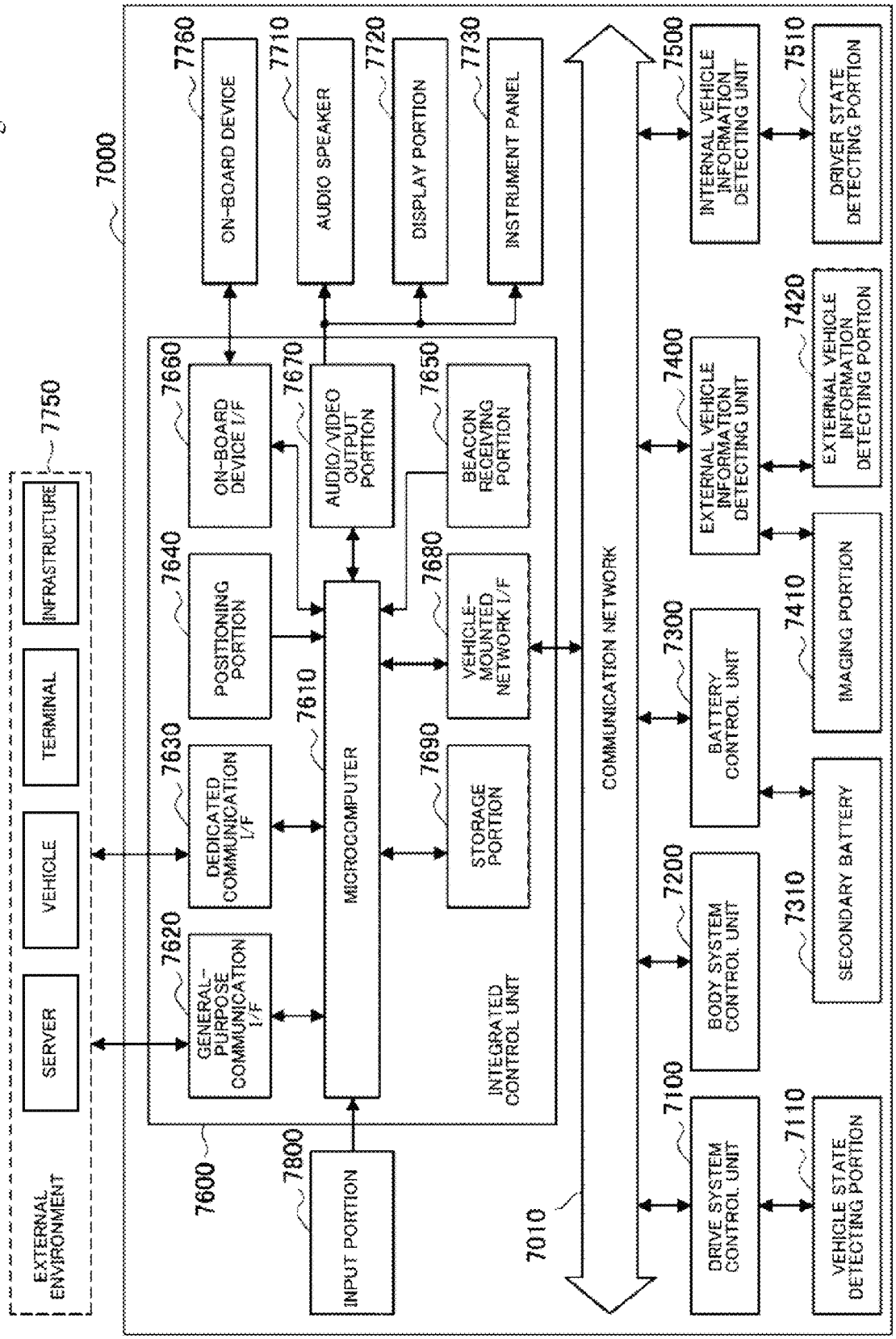
FIG. 13 is a block diagram showing a schematic configuration example of a vehicle control system that is an example of a mobile body control system to which the technique according to the present disclosure may be applied.

FIG. 13 is a block diagram showing a schematic configuration example of a vehicle control system 7000 that represents an example of a mobile body control system to which the technique according to the present disclosure may be applied. The vehicle control system 7000 includes a plurality of electronic control units that are connected via a communication network 7010. In the example shown in FIG. 13, the vehicle control system 7000 includes a drive system control unit 7100, a body system control unit 7200, a battery control unit 7300, an external vehicle information detecting unit 7400, an internal vehicle information detecting unit 7500, and an integrated control unit 7600. The communication network 7010 that connects the plurality of control units may be a vehicle-mounted communication network compliant with an arbitrary standard such as a CAN (Controller Area Network), a LIN (Local Interconnect Network), a LAN (Local Area Network), or FlexRay (registered trademark).

Each control unit includes a microcomputer that performs arithmetic processing in accordance with various programs, a storage portion that stores programs to be executed by the microcomputer, parameters to be used in various calculations, and the like, and a drive circuit that drives various apparatuses which are control targets. Each control unit includes a network I/F for communicating with other control units via the communication network 7010 and a communication I/F for communicating with apparatuses, sensors, and the like inside and outside the vehicle via wired communication or wireless communication. FIG. 13 illustrates, as functional components of the integrated control unit 7600, a microcomputer 7610, a general-purpose communication I/F 7620, a dedicated communication I/F 7630, a positioning portion 7640, a beacon receiving portion 7650, an on-board device I/F 7660, an audio/video output portion 7670, a vehicle-mounted network I/F 7680, and a storage portion 7690. The other control units similarly include a microcomputer, a communication I/F a storage portion, and the like.

The drive system control unit 7100 controls operations of apparatuses related to a drive system of a vehicle in accordance with various programs. For example, the drive system control unit 7100 functions as a control apparatus of a drive force generation apparatus for generating a drive force of the vehicle such as an internal engine or a drive motor, a control apparatus of a drive force transmission mechanism for transmitting the drive force to wheels, a control apparatus of a steering mechanism for adjusting a steering angle of the vehicle, and a control apparatus of a braking apparatus that generates a brake force of the vehicle. The drive system control unit 7100 may have functions as a control apparatus of an ABS (Antilock Brake System), a control apparatus of ESC (Electronic Stability Control), or the like.

A vehicle state detecting portion 7110 is connected to the drive system control unit 7100. For example, the vehicle state detecting portion 7110 includes at least one of a gyroscope sensor that detects an angular velocity of a rotational motion of a shaft of a vehicle body an acceleration sensor that detects an acceleration of the vehicle, and a sensor for detecting an operation amount of a gas pedal, an operation amount of a brake pedal, a steering angle of a steering wheel, the number of revolutions of an engine, a rotational speed of a wheel, or the like. The drive system control unit 7100 performs arithmetic processing using a signal input, from the vehicle state detecting portion 7110 and controls an internal engine, a drive motor, an electric power steering apparatus, a brake apparatus, or the like.

The body system control unit 7200 controls operations of various apparatuses mounted to the vehicle body in accordance with various programs. For example, the body system control unit 7200 functions as a control apparatus of a keyless entry system, a smart key system, a power window apparatus, or various lamps such as head lamps, tail lamps, brake lamps, turn indicators, and fog lamps. In this case, radio waves or signals of various switches which are transmitted from a portable device that substitutes as a key may be input to the body system control unit 7200. The body system control unit 7200 accepts input of the radio waves or signals and controls a door lock apparatus, the power window apparatus, the lamps, and the like of the vehicle.

The battery control unit 7300 controls a secondary battery 7310 that is a power supply source of the drive motor in accordance with various programs. For example, information on a battery temperature, a battery output voltage, a battery remaining capacity, or the like is input to the battery control unit 7300 from a battery apparatus including the secondary battery 7310. The battery control unit 7300 uses these signals to perform arithmetic processing to control temperature regulation of the secondary battery 7310 or to control a cooling apparatus or the like included in the battery apparatus.

The external vehicle information detecting unit 7400 detects information on an exterior of the vehicle that is mounted with the vehicle control system 7000. For example, at least one of an imaging portion 7410 and an external vehicle information detecting portion 7420 is connected to the external vehicle information detecting unit 7400. The imaging portion 7410 includes at least, one of a ToF (Time of Flight) camera, a stereo camera, a monocular camera, an infrared camera, and other cameras. For example, the external vehicle information detecting portion 7420 includes at least one of an environmental sensor for detecting present weather or meteorological phenomena and an ambient information detection sensor for detecting other vehicles, obstacles, pedestrians, or the like around the vehicle mounted with the vehicle control system 7000.

For example, the environmental sensor may be at least one of a raindrop sensor that detects rainy weather, a fog sensor that detects fog, a sunshine sensor that detects a degree of sunshine, and a snow sensor that detects snowfall. The ambient information detection sensor may be at least one of an ultrasonic sensor, a radar apparatus, and a LIDAR (Light Detection and Ranging, Laser Imaging Detection and Ranging) apparatus. The imaging portion 7410 and the external vehicle information detecting portion 7420 may be respectively included as an independent sensor or an independent apparatus or may be included as an apparatus that integrates a plurality of sensors or apparatuses.

Figure 14:
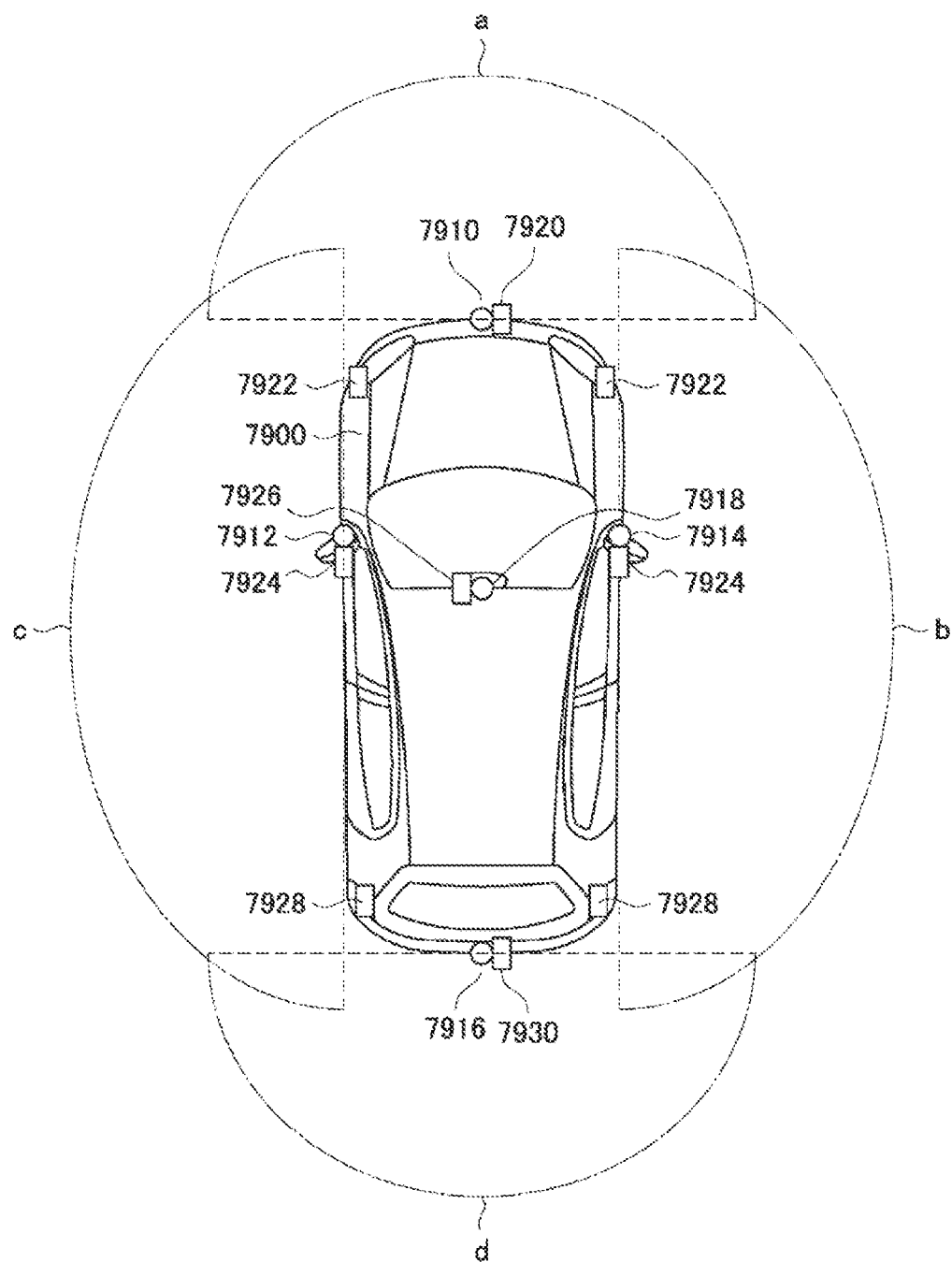
FIG. 14 is a diagram showing an example of an installation position of a ranging apparatus.

FIG. 14 is a diagram showing an example of installation positions of the imaging portion 7410 and the external vehicle information detecting portion 7420. For example, imaging portions 7910, 7912, 7914, 7916, and 7918 are provided at at least one position among a front nose, a side mirror, a rear bumper, a rear door, and an upper part of a front glass inside a cabin of a vehicle 7900. The imaging portion 7910 that is provided on the front nose and the imaging portion 7918 that is provided in the upper part of the front glass inside the cabin mainly acquire an image of the front of the vehicle 7900. The imaging portions 7912 and 7914 that are provided on the side mirrors mainly acquire an image of the sides of the vehicle 7900. The imaging portion 7916 that is provided on the rear bumper or the rear door mainly acquires an image of the rear of the vehicle 7900. The imaging portion 7918 that is provided in the upper part of the front glass inside the cabin is mainly used to detect vehicles ahead, pedestrians, obstacles, traffic lights, traffic signs, lanes, and the like.

FIG. 14 shows an example of photographic ranges of the respective imaging portions 7910, 7912, 7914, and 7916. An imaging range a represents an imaging range of the imaging portion 7910 that is provided on the front nose, imaging ranges b and c respectively represent imaging ranges of the imaging portions 7912 and 7914 that are provided on the side mirrors, and an imaging range d represents an imaging range of the imaging portion 7916 that is provided on the rear bumper or the rear door. For example, by superimposing image data captured by the imaging portions 7910, 7912, 7914, and 7916, a bird's-eye view image of the vehicle 7900 as viewed from above is obtained.

For example, external vehicle information detecting portions 7920, 7922, 7924, 7926, 7928, and 7930 that are provided in the front, the rear, the sides, a corner, and the upper part of the front glass inside the cabin of the vehicle 7900 may be ultrasonic sensors or radar apparatuses. For example, the external vehicle information detecting portions 7920, 7926, and 7930 provided on the front nose, the rear bumper, the rear door, and the upper part of the front glass inside the cabin of the vehicle 7900 may be LIDAR apparatuses. The external vehicle information detecting portions 7920 to 7930 are mainly used to detect vehicles ahead, pedestrians, obstacles, and the like.

Let us return to FIG. 13 to continue with the description. The external vehicle information detecting unit 7400 causes the imaging portion 7410 to capture an image of the exterior of the vehicle and receives captured image data. In addition, the external vehicle information detecting unit 7400 receives detection information from the external vehicle information detecting portion 7420 being connected thereto. When the external vehicle information detecting portion 7420 is an ultrasonic sensor, a radar apparatus, or a LIDAR apparatus, the external vehicle information detecting unit 7400 causes the external vehicle information detecting portion 7420 to transmit ultrasonic waves, electromagnetic waves, or the like and receives information on received reflected waves. Based on the received information, the external vehicle information detecting unit 7400 may perform object detection processing or distance detection processing with respect to people, vehicles, obstacles, signs, characters on road surfaces, and the like. Based on the received information, the external vehicle information detecting unit 7400 may perform environmental recognition processing for recognizing rainfall, fog, road surface conditions, or the like. Based on the received information, the external vehicle information detecting unit 7400 may calculate a distance to an object outside of the vehicle.

In addition, based on received image data, the external vehicle information detecting unit 7400 may perform image recognition processing or distance detection processing for recognizing people, vehicles, obstacles, signs, characters on road surfaces, and the like. The external vehicle information detecting unit 7400 may perform processing such as distortion correction or positioning with respect to the received image data and composite the image data captured by different imaging portions 7410 to generate a bird's-eye view image or a panoramic image. The external vehicle information detecting unit 7400 may perform viewpoint transformation processing using image data captured by different imaging portions 7410.

The internal vehicle information detecting unit 7500 detects information on an interior of the vehicle. For example, a driver state detecting portion 7510 that detects a state of a driver is connected to the internal vehicle information detecting unit 7500. The driver state detecting portion 7510 may include a camera that captures an image of the driver, a biometric sensor that detects biological information of the driver, a microphone that collects sound inside the cabin, or the like. For example, the biometric sensor is provided on a seat surface, the steering wheel, or the like, and detects biological information of a passenger sitting on the seat or the driver holding the steering wheel. Based on detection information input from the driver state detecting portion 7510, the internal vehicle information detecting unit 7500 may calculate a degree of fatigue or a degree of concentration of the driver or may determine whether or not the driver has fallen asleep. The internal vehicle information detecting unit 7500 may perform processing such as noise cancellation processing with respect to a collected sound signal.

The integrated control unit 7600 controls overall operations in the vehicle control system 7000 in accordance with various programs. An input portion 7800 is connected to the integrated control unit 7600. The input portion 7800 is realized by an apparatus on which a passenger can perform input operations such as a touch panel, a button, a microphone, a switch, or a lever. Data obtained by subjecting sound input from the microphone to speech recognition may be input to the integrated control unit 7600. For example, the input portion 7800 may be a remote-controlled apparatus using infrared light or other radio waves or an externally-connected device such as a mobile phone or a PDA (Personal Digital Assistant) that accommodates operations of the vehicle control system 7000. For example, the input portion 7800 may be a camera, in which case a passenger can input information by gesturing to the camera. Alternatively, data obtained by detecting a motion of a wearable apparatus being worn by a passenger may be input. Furthermore, for example, the input portion 7800 described above may include an input control circuit or the like which generates an input signal based on information input by a passenger or the like using the input portion 7800 and which outputs the generated input signal to the integrated control unit 7600. By operating the input portion 7800, a passenger or the like inputs various types of data and issues instructions to perform processing operations with respect to the vehicle control system 7000.

The storage portion 7690 may include a ROM (Read Only Memory) that stores various programs to be executed by the microcomputer and a RAM (Random Access Memory) that stores various parameters, calculation results, sensor values, or the like. In addition, the storage portion 7690 may be realized by a magnetic storage device such as an HDD (Hard Disk Drive), a semiconductor storage device, an optical storage device, a magneto-optical storage device, or the like.

The general-purpose communication I/F 7620 is a general-purpose communication I/F that mediates communication with various devices that are present in an external environment 7750. The general-purpose communication I/F 7620 may implement a cellular communication protocol such as GSM (registered trademark) (Global System of Mobile communications), WiMAX, LTE (Long Term Evolution), or LTE-A (LTE-Advanced) or another wireless communication protocol such as wireless LAN (also referred to as Wi-Fi (registered trademark)) or Bluetooth (registered trademark). For example, the general-purpose communication I/F 7620 may connect to a device (for example, an application server or a control server) present on an external network (for example, the Internet, a cloud network, or a company-specific network) via a base station or an access point. In addition, for example, the general-purpose communication I/F 7620 may connect to a terminal (for example, a terminal belonging to the driver or a pedestrian, a terminal of a store, or an MTC (Machine Type Communication) terminal) that is present in a vicinity of the vehicle using P2P (Peer To Peer) technology.

The dedicated communication I/F 7630 is a communication I/F that supports a communication protocol designed to be used in a vehicle. For example, the dedicated communication I/F 7630 may implement a standard protocol such as WAVE (Wireless Access in Vehicle Environment) that is a combination of IEEE 802.11p constituting a lower layer and IEEE 1609 constituting a higher layer, DSRC (Dedicated Short Range Communications), or a cellular communication protocol. Typically, the dedicated communication I/F 7630 carries out V2X communication that is a concept including one or more of communication between vehicles (Vehicle to Vehicle communication), communication between a road and a vehicle (Vehicle to Infrastructure communication), communication between a vehicle and a home (Vehicle to Home communication), and communication between a pedestrian and a vehicle (Vehicle to Pedestrian communication).

For example, the positioning portion 7640 receives a GNSS (Global Navigation Satellite System) signal from a GNSS satellite (for example, a UPS (Global Positioning System) signal from a UPS satellite) and executes positioning, and generates positional information including a latitude, a longitude, and an elevation of the vehicle. Alternatively the positioning portion 7640 may specify a current position by exchanging signals with a wireless access point or acquire positional information from a terminal such as a mobile phone, a PHS, or a smartphone with a positioning function.

For example, the beacon receiving portion 7650 receives radio waves or electromagnetic waves emitted from a radio station or the like installed on a road and acquires information such as a current position, congestions, closures, and required time. Alternatively, the function of the beacon receiving portion 7650 may be included in the dedicated communication I/F 7630 described above.

The on-board device I/F 7660 is a communication interface that mediates communication between the microcomputer 7610 and various on-board devices 7760 that are present inside the vehicle. The on-board device I/F 7660 may establish a wireless connection using a wireless communication protocol such as a wireless LAN, Bluetooth (registered trademark), NFC (Near Field Communication), or WUSB (Wireless USB). In addition, the on-board device I/F 7660 may establish, via a connection terminal (not illustrated) (and a cable when necessary), a wired connection such as USB (Universal Serial Bus), HDMI (registered trademark) (High-Definition Multimedia Interface), or MHL (Mobile High-definition Link). For example, the on-board devices 7760 may include at least one of a mobile device or a wearable device that is held or worn by a passenger and an information device to be carried onto or attached to the vehicle. Furthermore, the on-board devices 7760 may include a navigation apparatus that searches a route to an arbitrary destination. The on-board device I/F 7660 exchanges control signals and data signals with the on-board devices 7760.

The vehicle-mounted network I/F 7680 is an interface that mediates communication between the microcomputer 7610 and the communication network 7010. The vehicle-mounted network I/F 7680 transmits and receives signals and the like in accordance with a prescribed protocol that is supported by the communication network 7010.

The microcomputer 7610 of the integrated control unit 7600 controls the vehicle control system 7000 in accordance with various programs based on information acquired via at least one of the general-purpose communication I/F 7620, the dedicated communication I/F 7630, the positioning portion 7640, the beacon receiving portion 7650, the on-board device I/F 7660, and the vehicle-mounted network I/F 7680. For example, based on acquired information on the exterior and the interior of the vehicle, the microcomputer 7610 may calculate a control target value of the drive force generation apparatus, the steering mechanism, or the brake apparatus and output a control command to the drive system control unit 7100. For example, the microcomputer 7610 may perform cooperative control for the purpose of realizing functions of an ADAS (Advanced Driver Assistance System) including collision avoidance or crash mitigation of the vehicle, headway control based on inter-vehicular distance, cruise control, a collision warning of the vehicle, and a lane departure warning of the vehicle. In addition, by controlling the drive force generation apparatus, the steering mechanism, the brake apparatus, or the like based on acquired information on a periphery of the vehicle, the microcomputer 7610 may perform cooperative control for the purpose of automated driving or the like that enables the vehicle to travel autonomously without having to rely on operations by the driver.

The microcomputer 7610 may generate three-dimensional distance information between the vehicle and a surrounding object such as a structure or a person and create local map information including peripheral information of a current position of the vehicle based on information acquired via at least one of the general-purpose communication I/F 7620, the dedicated communication I/F 7630, the positioning portion 7640, the beacon receiving portion 7650, the on-board device I/F 7660, and the vehicle-mounted network I/F 7680. In addition, based on acquired information, the microcomputer 7610 may predict danger such as a collision involving the vehicle, an approach by a pedestrian or the like, or entering a closed road and generate a warning signal. For example, the warning signal may be a signal for generating a warning sound or turning on a warning lamp.

The audio/video output portion 7670 transmits an output signal of at least one of sound and an image to an output apparatus that is capable of audibly or visually notifying information to a passenger of the vehicle or to the outside of the vehicle. In an example shown in FIG. 13, an audio speaker 7710, a display portion 7720, and an instrument panel 7730 are exemplified as output apparatuses. For example, the display portion 7720 may include at least, one of an on-board display and a head-up display. The display portion 7720 may have an AR (Augmented Reality) display function. The output apparatus may be an apparatus other than those described above such as headphones, a wearable device such as a spectacle-type display that is worn by a passenger, a projector, or a lamp. When the output apparatus is a display apparatus, the display apparatus displays, in various formats such as a text, an image, a table, and a graph, results obtained by various types of processing performed by the microcomputer 7610 or information received from other control units. In addition, when the output apparatus is an audio output apparatus, the audio output apparatus converts an audio signal constituted by reproduced speech data, acoustic data, or the like into an analog signal and auditorially outputs the converted analog signal.

In the example shown in FIG. 13, at least two control units connected via the communication network 7010 may be integrated as a single control unit. Alternatively each control unit may be constituted by a plurality of control units. Furthermore, the vehicle control system 7000 may include other control units that are not illustrated. In addition, a part of or all of the functions assumed by any control unit in the description provided above may be shouldered by another control unit. In other words, as long as information is to be transmitted and received via the communication network 7010, prescribed arithmetic processing may be performed by any control unit. In a similar manner, a sensor or an apparatus connected to any control unit may be connected to another control unit and, at the same time, a plurality of control units may mutually transmit and receive detection information via the communication network 7010.

This concludes the description of an example of a vehicle control system to which the technique according to the present disclosure may be applied. The technique according to the present disclosure may be applied to, for example, the imaging portions 7910, 7912, 7914, 7916, and 7918 and external vehicle information detecting portions 7920, 7922, 7924, 7926, 7928, and 7930 among the configuration described above. In addition, by applying the technique according to the present disclosure, since the light detection apparatus 30 can accommodate a specified vehicle-mount temperature and perform a light detection operation in a wide temperature range without causing a latching current problem, for example, a vehicle control system capable of detecting an imaging object with high accuracy can be constructed.

Configurations Adoptable by Present Disclosure

The present disclosure can also be configured as follows.

A Light Detection Apparatus

[A-1] A light detection apparatus, including:
a light-receiving element;
a load circuit connected to the light-receiving element; and
a control portion configured to control a recharge current that flows through the load circuit in accordance with an element characteristic of the light-receiving element.

[A-2] The light detection apparatus according to [A-1], wherein
the element characteristic of the light-receiving element is a temperature of the light-receiving element that is detected by a temperature sensor.

[A-3] The light detection apparatus according to [A-2], wherein
the control portion is configured to perform control involving raising the recharge current in accordance with a drop in the temperature of the light-receiving element.

[A-4] The light detection apparatus according to [A-1], wherein
the element characteristic of the light-receiving element is an avalanche current of the fight-receiving element

[A-5] The light detection apparatus according to [A-4], wherein
the control portion is configured to control the recharge current so that a ratio between the avalanche current of the light-receiving element and the recharge current becomes constant.

[A-6] The light detection apparatus according to [A-1], wherein
the element characteristic of the light-receiving element is a breakdown voltage of the light-receiving element.

[A-7] The light detection apparatus according to [A-6], wherein
the control portion is configured to perform control involving raising the recharge current in accordance with a drop in the breakdown voltage of the light-receiving element,

[A-8] The light detection apparatus according to [A-7], wherein
the control portion is configured to perform control of the recharge current based on a lookup table that associates the breakdown voltage of the fight-receiving element and the recharge current with each other.

[A-9] The light detection apparatus according to any one of [A-1] to [A-8], wherein
the light-receiving element is an element configured to generate a signal in response to receiving a photon.

[A-10] The light detection apparatus according to [A-9], wherein
the light-receiving element is constituted by a single photon avalanche diode.

B. Ranging Apparatus (Distance Measurement Apparatus)

[B-1] A ranging apparatus having a light source configured to radiate light toward a measurement object and a light detection apparatus configured to detect light reflected by the measurement object, wherein
the light detection apparatus includes:
a light-receiving element;
a load circuit connected to the light-receiving element; and
a control portion configured to control a recharge current that flows through the load circuit in accordance with an element characteristic of the light-receiving element.

[B-2] The ranging apparatus according to [B-1], wherein the element characteristic of the light-receiving element is a temperature of the light-receiving element that is detected by a temperature sensor.

[B-3] The ranging apparatus according to [B-2], wherein the control portion is configured to perform control involving raising the recharge current in accordance with a drop in the temperature of the light-receiving element.

[B-4] The ranging apparatus according to [B-1], wherein the element characteristic of the light-receiving element is an avalanche current of the light-receiving element.

[B-5] The ranging apparatus according to [B-4], wherein the control portion is configured to control the recharge current so that a ratio between the avalanche current of the light-receiving element and the recharge current becomes constant.

[B-6] The ranging apparatus according to [B-1], wherein the element characteristic of the light-receiving element is a breakdown voltage of the light-receiving element.

[B-7] The ranging apparatus according to [B-6], wherein the control portion is configured to perform control involving raising the recharge current in accordance with a drop in the breakdown voltage of the light-receiving element.

[B-8] The ranging apparatus according to [B-7], wherein the control portion is configured to perform control of the recharge current based on a lookup table that associates the breakdown voltage of the light-receiving element and the recharge current with each other.

[B-9] The ranging apparatus according to any one of [B-1] to [B-8], wherein
the light-receiving element is an element configured to generate a signal in response to receiving a photon.

[B-10] The ranging apparatus according to [B-9], wherein the light-receiving element is constituted by a single photon avalanche diode.

REFERENCE SIGNS LIST

1 Ranging apparatus
10 Subject (measurement object)
20 Light source
21 Laser driver
22 Laser light source
23 Diffusing lens
30 Light detection apparatus
31 Light-receiving lens
32 Light sensor
33 Circuit portion
40 Control portion
50 Pixel circuit
51 SPAD element
54 Waveform shaping circuit
55 Load circuit
61 Control portion
62 Temperature sensor
63 Avalanche current observation circuit
64 Reference SPAD element

The invention claimed is:

1. A light detection apparatus, comprising:
a light-receiving element including a first terminal electrically connected to a first predetermined voltage line;
a load circuit electrically connected in series with the light-receiving element between the first predetermined voltage line and a second predetermined voltage line; and
a control portion configured to control a recharge current that flows through the load circuit in accordance with an element characteristic of the light-receiving element, wherein the element characteristic of the light-receiving element is a temperature of the light-receiving element that is detected by a temperature sensor.

2. The light detection apparatus according to claim 1, wherein the control portion is configured to perform control involving raising the recharge current in accordance with a drop in the temperature of the light-receiving element.

3. The light detection apparatus according to claim 1, wherein the element characteristic of the light-receiving element is an avalanche current of the light-receiving element.

4. The light detection apparatus according to claim 3, wherein the control portion is configured to control the recharge current so that a ratio between the avalanche current of the light- receiving element and the recharge current becomes constant.

5. The light detection apparatus according to claim 1, wherein the element characteristic of the light-receiving element is a breakdown voltage of the light-receiving element.

6. The light detection apparatus according to claim 5, wherein the control portion is configured to perform control involving raising the recharge current in accordance with a drop in the breakdown voltage of the light-receiving element.

7. The light detection apparatus according to claim 6, wherein the control portion is configured to perform control of the recharge current based on a lookup table that associates the breakdown voltage of the light-receiving element and the recharge current with each other.

8. The light detection apparatus according to claim 1, wherein the light-receiving element is an element configured to generate a signal in response to receiving a photon.

9. The light detection apparatus according to claim 8, wherein the light-receiving element is constituted by a single photon avalanche diode.

10. A ranging apparatus, comprising:
a light source configured to radiate light toward a measurement object; and
a light detection apparatus configured to detect light reflected by the measurement object, wherein
the light detection apparatus includes:
a light-receiving element;
a load circuit connected to the light-receiving element; and
a control portion configured to control a recharge current that flows through the load circuit in accordance with an element characteristic of the light-receiving element, wherein the element characteristic of the light-receiving element is a temperature of the light-receiving element that is detected by a temperature sensor.

11. The ranging apparatus according to claim 10, wherein the control portion is configured to perform control involving raising the recharge current in accordance with a drop in the temperature of the light-receiving element.

12. The ranging apparatus according to claim 10, wherein the element characteristic of the light-receiving element is an avalanche current of the light-receiving element.

13. The ranging apparatus according to claim 12, wherein the control portion is configured to control the recharge current so that a ratio between the avalanche current of the light- receiving element and the recharge current becomes constant.

14. The ranging apparatus according to claim 10, wherein the element characteristic of the light-receiving element is a breakdown voltage of the light-receiving element.

15. The ranging apparatus according to claim 14, wherein the control portion is configured to perform control involving raising the recharge current in accordance with a drop in the breakdown voltage of the light-receiving element.

16. The ranging apparatus according to claim 15, wherein the control portion is configured to perform control of the recharge current based on a lookup table that associates the breakdown voltage of the light-receiving element and the recharge current with each other.

17. The ranging apparatus according to claim 10, wherein the light-receiving element is an element configured to generate a signal in response to receiving a photon.

18. The ranging apparatus according to claim 17, wherein the light-receiving element is constituted by a single photon avalanche diode.

* * * * *